(12) United States Patent
Shin et al.

(10) Patent No.: US 10,115,444 B1
(45) Date of Patent: Oct. 30, 2018

(54) DATA BIT INVERSION TRACKING IN CACHE MEMORY TO REDUCE DATA BITS WRITTEN FOR WRITE OPERATIONS

(71) Applicant: QUALCOMM Incorporated, San Diego, CA (US)

(72) Inventors: Hyunsuk Shin, San Diego, CA (US); Jung Pill Kim, San Diego, CA (US); Sungryul Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/672,992

(22) Filed: Aug. 9, 2017

(51) Int. Cl.
| | |
|---|---|
| *G11C 11/16* | (2006.01) |
| *G06F 13/42* | (2006.01) |
| *G06F 11/10* | (2006.01) |
| *H03M 13/29* | (2006.01) |
| *G11C 29/50* | (2006.01) |
| *G11C 29/04* | (2006.01) |
| *G11C 13/00* | (2006.01) |

(52) U.S. Cl.
CPC ...... *G11C 11/1673* (2013.01); *G06F 11/1012* (2013.01); *G06F 11/1048* (2013.01); *G06F 13/4204* (2013.01); *G11C 11/1655* (2013.01); *G11C 13/0069* (2013.01); *H03M 13/2906* (2013.01); *G11C 29/50* (2013.01); *G11C 2013/0076* (2013.01); *G11C 2029/0411* (2013.01)

(58) Field of Classification Search
CPC .......................... G11C 13/0069; G11C 11/161

USPC .................................................. 365/171, 148
See application file for complete search history.

(56) References Cited

U.S. PATENT DOCUMENTS

| | | | | | |
|---|---|---|---|---|---|
| 3,656,130 | A | * | 4/1972 | Bucklin, Jr. ........... | G11B 5/012 360/48 |
| 4,413,317 | A | * | 11/1983 | Swenson ............... | G06F 3/0601 710/38 |
| 4,425,615 | A | * | 1/1984 | Swenson ............. | G06F 12/0866 711/114 |
| 5,271,022 | A | * | 12/1993 | Berlekamp ............ | G03B 31/02 386/E9.045 |
| 5,530,960 | A | * | 6/1996 | Parks ...................... | G06F 11/22 710/5 |
| 5,610,872 | A | * | 3/1997 | Toda .................... | G11C 7/1072 365/189.11 |

(Continued)

*Primary Examiner* — Michael Tran
(74) *Attorney, Agent, or Firm* — Withrow & Terranova, PLLC

(57) ABSTRACT

Data bit inversion tracking in cache memory to reduce data bits written for write operations is disclosed. In one aspect, a cache memory including a cache controller and a cache array is provided. The cache array includes one or more cache entries, each of which includes a cache data field and a bit change track field. The cache controller compares a current cache data word to a new data word to be written and stores a bit track change word representing the difference (i.e., inverted bits) between the current cache data word and the new data word in the bit change track field. By using the bit track change word stored in the bit change track field to determine whether fewer bit writes are required to write data in an inverted or a non-inverted form, power consumption can be reduced for write operations through reduced bit write operations.

31 Claims, 13 Drawing Sheets

(56) References Cited

U.S. PATENT DOCUMENTS

| | | | |
|---|---|---|---|
| 5,958,414 A * | 9/1999 | Regnery | A61K 39/0233 |
| | | | 424/184.1 |
| 8,606,982 B2 | 12/2013 | Maldei et al. | |
| 9,047,969 B2 | 6/2015 | Alam et al. | |
| 9,070,467 B2 | 6/2015 | Kim et al. | |
| 9,324,072 B1 * | 4/2016 | Roberts | G06Q 20/3576 |
| 9,454,432 B2 | 9/2016 | Alam et al. | |
| 9,502,089 B2 | 11/2016 | Andre et al. | |
| 9,830,988 B2 * | 11/2017 | Augustine | G11C 13/0069 |
| 2005/0152234 A1 * | 7/2005 | Hosokawa | G11B 11/10584 |
| | | | 369/13.41 |
| 2008/0130428 A1 * | 6/2008 | Kojima | G11B 7/0053 |
| | | | 369/44.13 |
| 2010/0054022 A1 * | 3/2010 | Beck | G11C 7/1006 |
| | | | 365/149 |
| 2013/0332799 A1 * | 12/2013 | Cho | G06F 11/10 |
| | | | 714/764 |
| 2014/0136764 A1 * | 5/2014 | Li | G11C 16/08 |
| | | | 711/103 |
| 2014/0372814 A1 * | 12/2014 | Oberlaender | G06F 11/1048 |
| | | | 714/719 |
| 2015/0092502 A1 * | 4/2015 | Yang | G11C 7/08 |
| | | | 365/191 |
| 2015/0269991 A1 * | 9/2015 | Hsieh | G11C 29/32 |
| | | | 365/154 |
| 2017/0132140 A1 * | 5/2017 | Lin | G06F 12/0875 |
| 2018/0068714 A1 * | 3/2018 | Liang | G11C 11/418 |
| 2018/0074892 A1 * | 3/2018 | Shappir | G06F 11/1068 |

\* cited by examiner

DATA BIT INVERSION TRACKING IN CACHE MEMORY TO REDUCE DATA BITS WRITTEN FOR WRITE OPERATIONS

BACKGROUND

I. Field of the Disclosure

The technology of the disclosure relates generally to memory systems provided in processor-based systems for storing data, and more particularly to memory systems that include the capability of storing data in an inverted form in memory to reduce data bit write operations.

II. Background

Semiconductor storage devices are incorporated in integrated circuits (ICs) in electronic devices to provide data storage. One example of a semiconductor storage device is static random access memory (SRAM). Another example of a semiconductor storage device is magneto-resistive random access memory (MRAM). It may be advantageous to use MRAM in place of SRAM for memory applications because MRAM is non-volatile memory in which data is stored by programming a magnetic tunnel junction (MTJ) as part of an MRAM bit cell. An advantage of MRAM is that MTJs in MRAM bit cells can retain stored information even when power is turned off. This is because data is stored in the MTJ as a small magnetic element rather than as an electric charge or current.

In this regard, an MTJ comprises a free ferromagnetic layer ("free layer") disposed above or below a fixed or pinned ferromagnetic layer ("pinned layer"). The free and pinned layers are separated by a tunnel junction (also known as a tunnel barrier) formed by a thin non-magnetic dielectric layer. The magnetic orientation of the free layer can be changed, but the magnetic orientation of the pinned layer is fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written and stored in the MTJ by generating a write current across the MTJ to induce a spin transfer torque (STT). In this manner, the spin polarization of carrier electrons can be used to change the orientation of the free layer to either a P or AP magnetic orientation with respect to the pinned layer.

However, compared to SRAM, MRAM write operations typically require more power because a sufficient current must be generated to cause the free layer in an MRAM bit cell to set its magnetic orientation. For example, at an operation frequency of 200 megahertz (MHz), an SRAM may require a write current of 3.6 milliamperes (mA) while an MRAM may require a write current of 18 mA. To reduce the power consumed by MRAM during write operations, conventional MRAM systems may employ a read-modify-write (RMW) scheme, which can reduce the number of written bits to conserve power. In an RMW scheme, every write operation first incurs a read operation and a modify operation.

For example, FIG. 1 illustrates an RMW operation that involves writing a new data word '11101100' to an MRAM array 100 in an MRAM macro 102. The MRAM array 100 includes a plurality of data entries each configured to store data words. Only one data entry 104 in the MRAM array 100 is shown in FIG. 1 for example purposes. An MRAM controller 106 provided in the MRAM macro 102 is configured to control read and write accesses to data entries in the MRAM array 100. In the exemplary write operation shown in step 1 of FIG. 1, a memory address 108 (ADDR) and an eight-bit new data word '11101100' (DATA) of a memory write request 110 to be written to the MRAM array 100 is provided to the MRAM controller 106. In this example, the memory address 108 (ADDR) of the memory write request 110 is mapped to the data entry 104 in the MRAM array 100 shown in FIG. 1. In step 2, the MRAM controller 106 reads the current data word '10110111' from the data entry 104 at the memory address 108 (ADDR) in the MRAM array 100 into the MRAM controller 106. This allows the MRAM controller 106 to determine if fewer bit writes are required to store the new data word '11101100' (DATA) in the data entry 104 in an inverted form or a non-inverted form in the MRAM array 100. In step 3, the MRAM controller 106 receives and decodes an error-correcting code (ECC) for the current data word '10110111' in the data entry 104 in the MRAM array 100. In step 4, the MRAM controller 106 determines inverted bits between the new data word '11101100' and the current data word '10110111.' In this example, the bits that need to be inverted to write the new data word '11101100' (DATA) in the data entry 104 at the memory address 108 (ADDR) in the MRAM array 100 are underlined as follows: '10110111.' As shown in a later step, inverting the underlined bits in the current data word '10110111' allows the new data word '11101100' to be written in the data entry 104 of the memory address 108 (ADDR) by performing write operations on only five bits as opposed to writing all eight bits of the data entry 104. In step 5, the MRAM controller 106 generates a new ECC based on the new data word '11101100' (DATA), because in this example, ECC correction check and generation circuitry is provided in the MRAM controller 106 of the MRAM macro 102. As noted above, the MRAM controller 106 then only performs write operations for the bits noted as inverted bits between the current data word '10110111' and the new data word '11101100' (DATA), indicated as the underlined bits in FIG. 1 and in the description above. In this manner, the new data word '11101100' (DATA) can be written to the data entry 104 at the memory address 108 (ADDR) so as to reduce the number of bits written. Thus, step 6 in FIG. 1 illustrates writing the new data word '11101100' (DATA) to the memory address 108 (ADDR) in the MRAM array 100 while reducing the number of write operations performed as compared to performing write operations on every bit of the current data word.

While the MRAM controller 106 in the MRAM macro 102 in FIG. 1 can implement an RMW scheme for write operations to reduce the number of bits to be written for write operations, write operations can still suffer from additional power consumption and slower performance due to first having to read (R) and modify (M) data from the MRAM array 100. Every write operation in an RMW scheme incurs an RMW operation.

SUMMARY OF THE DISCLOSURE

Aspects disclosed in the detailed description include data bit inversion tracking in cache memory to reduce data bits written for write operations. Reducing the number of data bits written to memory can reduce power consumption as an example. In this regard, in exemplary aspects disclosed herein, a memory system is provided that includes a main memory or system memory for storing data. The memory system also includes a cache memory for storing cached versions of the data stored in the main memory. The cache memory includes a cache controller and a cache array. The cache array includes one or more cache entries, each of which includes a cache data field for storing cached data from the main memory and a corresponding bit change track field. In a write operation, in response to a cache hit in the cache memory, the cache controller is configured to compare a current cache data word stored in a cache entry corresponding to a memory address of the write operation to a new data word in the write operation to be written. The cache controller is configured to store a bit change track word in the bit change track field in the cache entry representing the difference (i.e., inverted bits) between the current cache data word in the cache entry and the new data word. If the bit change track word has fewer inverted bits than non-inverted bits, then writing the new data word back to the main memory in a non-inverted form may require fewer bits to be written (e.g., for a write-through or write-back scheme). However, if the bit change track word has more inverted bits than non-inverted bits, then writing the new data word in the main memory in an inverted form may require fewer bits to be written. By using the bit change track word stored in the bit change track field of the cache entry to determine whether fewer bit writes are required to write data in an inverted or a non-inverted form, power consumption can be reduced for write operations through reduced bit write operations.

Thus, by providing data bit inversion tracking in the cache memory, the cache controller can perform data bit inversion operations for write operations without having to first read the current data word from the main memory if a cache hit occurs in response to the write operation. Therefore, for example, a read-modify-write (RMW) scheme can be avoided if desired for performing data bit inversion operations for write operations that result in a cache hit to the cache memory. Also, by providing data bit inversion tracking in the cache memory, new data words stored in the cache memory can be written back to the main memory without having to first perform a read operation to the main memory. For example, data words stored in the cache memory may be written back to the main memory in a write-through scheme, or in response to an eviction of a cache entry from the cache memory as part of a write-back scheme.

In other exemplary aspects disclosed herein, if a cache miss occurs in the cache memory in response to a write operation, the cache controller can first read the current data word from the main memory at the memory address of the write operation into the cache memory before performing the data bit comparison operation discussed above. In other exemplary aspects disclosed herein, the cache controller can also be configured to generate an error-correcting code (ECC) for write operations based on whether the new data word is written in the inverted or the non-inverted form. Data bit inversion tracking in cache memory can be employed in many types of memory systems to reduce the number of data bits written for write operations. However, data bit inversion tracking in cache memory may be particularly advantageous in memory systems that include magneto-resistive random access memory (MRAM), where higher power consumption may be incurred for write operations over other memory systems, such as static random access memory (SRAM) systems for example.

In this regard in one aspect, a cache memory including a cache array and a cache controller is provided. The cache array includes one or more cache entries, and each cache entry includes a cache data field and a bit change track field. The cache controller is configured to write data in the one or more cache entries of the cache array. In this regard, the cache controller is configured to receive a write request comprising a memory address and a write data word. The cache controller is further configured to generate a bit change track word in the bit change track field in a cache entry among the one or more cache entries in the cache array corresponding to the memory address of the write request. The bit change track word indicates a bit inversion state based on bit inversions between the write data word and a current cache data word stored in the cache data field in the cache entry. The cache controller is also configured to determine if the write data word is to be stored in an inverted form based on the bit inversion state. Responsive to determining that the write data word is to be stored in the inverted form, the cache controller is configured to cause the write data word to be stored in association with the memory address of the write request in the inverted form.

In another aspect, a cache memory including a means for storing cache data and a means for writing cache data is provided. The means for storing cache data includes one or more cache entries, and each cache entry includes a data field and a bit change track field. The means for writing cache data in the one or more cache entries of the means for storing cache data includes a means for receiving a write request including a memory address and a write data word. The means for writing cache data further includes a means for generating a bit change track word in the bit change track field in a cache entry among the one or more cache entries in the means for storing cache data corresponding to the memory address of the write request. The bit change track word indicates a bit inversion state based on bit inversions between the write data word and a current cache data word stored in the data field in the data entry. The means for writing cache data also includes a means for determining if the write data word is to be stored in an inverted form based on the bit inversion state. Responsive to determining that the write data word is to be stored in the inverted form, a means for causing the write data word to be stored in association with the memory address of the write request in the inverted form is also provided.

In another aspect, a method of storing data in response to a write operation is provided. The method includes receiving a write request comprising a memory address and a write data word. The method also includes generating a bit change track word in a bit change track field in a cache entry among one or more cache entries in a cache array corresponding to the memory address of the write request. The bit change track word indicates a bit inversion state based on bit inversions between the write data word and a current cache data word stored in a cache data field in the cache entry. The method includes determining if the write data word is to be stored in an inverted form based on the bit inversion state and, responsive to determining that the write data word is to be stored in the inverted form, causing the write data word to be stored in association with the memory address of the write request in the inverted form.

In another aspect, a memory system including a higher-level memory and a cache memory is provided. The higher-level memory includes one or more memory entries, each associated with a memory address and each comprising a data field. The cache memory includes a cache array and a cache controller. The cache array includes one or more cache entries, and each cache entry is associated with a memory entry among the one or more memory entries of the higher-level memory and includes a cache data field and a bit change track field. The cache controller is configured to write data in the one or more cache entries of the cache array. In this regard, the cache controller is configured to receive a write request including a memory address associated with one of the one or more memory entries of the higher-level memory and a write data word. The cache controller is further configured to generate a bit change track word in the bit change track field in a cache entry among the one or more cache entries in the cache array corresponding to the memory address of the write request. The bit change track word indicates a bit inversion state based on bit inversions between the write data word and a current cache data word stored in the cache data field in the cache entry. The cache controller is also configured to determine if the write data word is to be stored in an inverted form based on the bit inversion state. The cache controller is configured to, responsive to determining that the write data word is to be stored in the inverted form, cause the write data word to be stored in association with the memory address of the write request in the inverted form. The higher-level memory is configured to store the write data word in the inverted form in a data field of one of the one or more memory entries.

DETAILED DESCRIPTION

Figure 1:
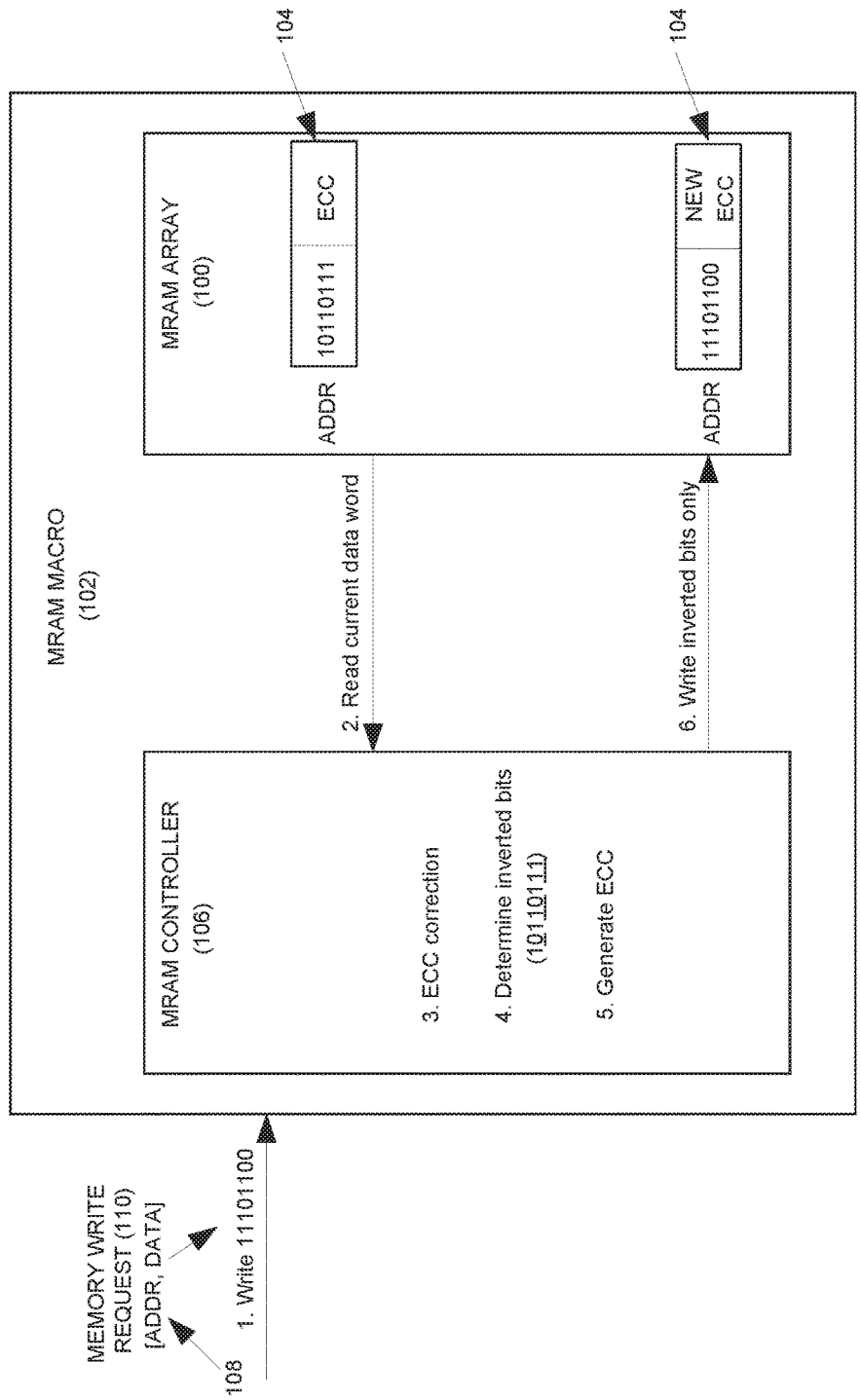
FIG. 1 is a block diagram of an exemplary memory system illustrating a conventional read-modify-write (RMW) operation that involves using a magneto-resistive random access memory (MRAM) controller to write a new data word to an MRAM array in a MRAM macro.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include data bit inversion tracking in cache memory to reduce data bits written for write operations. Reducing the number of data bits written to memory can reduce power consumption as an example. In this regard, in exemplary aspects disclosed herein, a memory system is provided that includes a main memory or system memory for storing data. The memory system also includes a cache memory for storing cached versions of the data stored in the main memory. The cache memory includes a cache controller and a cache array. The cache array includes a plurality of cache entries, each of which include a cache data field for storing cached data from the main memory and a corresponding bit change track field. In a write operation, in response to a cache hit in the cache memory, the cache controller is configured to compare a current cache data word stored in a cache entry corresponding to a memory address of the write operation to a new data word in the write operation to be written. The cache controller is configured to store a bit change track word in the bit change track field in the cache entry representing the difference (i.e., inverted bits) between the current cache data word in the cache entry and the new data word. If the bit change track word has fewer inverted bits than non-inverted bits, then writing the new data word back to the main memory in a non-inverted form may require fewer bits to be written (e.g., for a write-through or write-back operation). However, if the bit change track word has more inverted bits than non-inverted bits, then writing the new data word in the main memory in an inverted form may require fewer bits to be written. By using the bit change track word stored in the bit change track field of the cache entry to determine whether fewer bit writes are required to write data in an inverted or a non-inverted form, power consumption can be reduced for write operations through reduced bit write operations.

Thus, by providing data bit inversion tracking in the cache memory, the cache controller can perform data bit inversion operations for write operations without having to first read the current data word from the main memory if a cache hit occurs in response to the write operation. Therefore, for example, a read-modify-write (RMW) scheme can be avoided if desired for performing data bit inversion operations for write operations that result in a cache hit to the cache memory. Also, by providing data bit inversion tracking in the cache memory, new data words stored in the cache memory can be written back to the main memory without having to first perform a read operation to the main memory. For example, data words stored in the cache memory may be written back to the main memory in a write-through scheme, or in response to an eviction of a cache entry from the cache memory as part of a write-back scheme.

In other exemplary aspects disclosed herein, if a cache miss occurs in the cache memory in response to a write operation, the cache controller can first read the current data word from the main memory at the memory address of the write operation into the cache memory before performing the data bit comparison operation discussed above. In other exemplary aspects disclosed herein, the cache controller can also be configured to generate an error-correcting code (ECC) for write operations based on whether the new data word is written in the inverted or the non-inverted form. Data bit inversion tracking in cache memory can be employed in many types of memory systems to reduce the number of data bits written for write operations. However, data bit inversion tracking in cache memory may be particularly advantageous in memory systems that include magneto-resistive random access memory (MRAM), where higher power consumption may be incurred for write operations over other memory systems, such as static random access memory (SRAM) systems for example.

Figure 2:
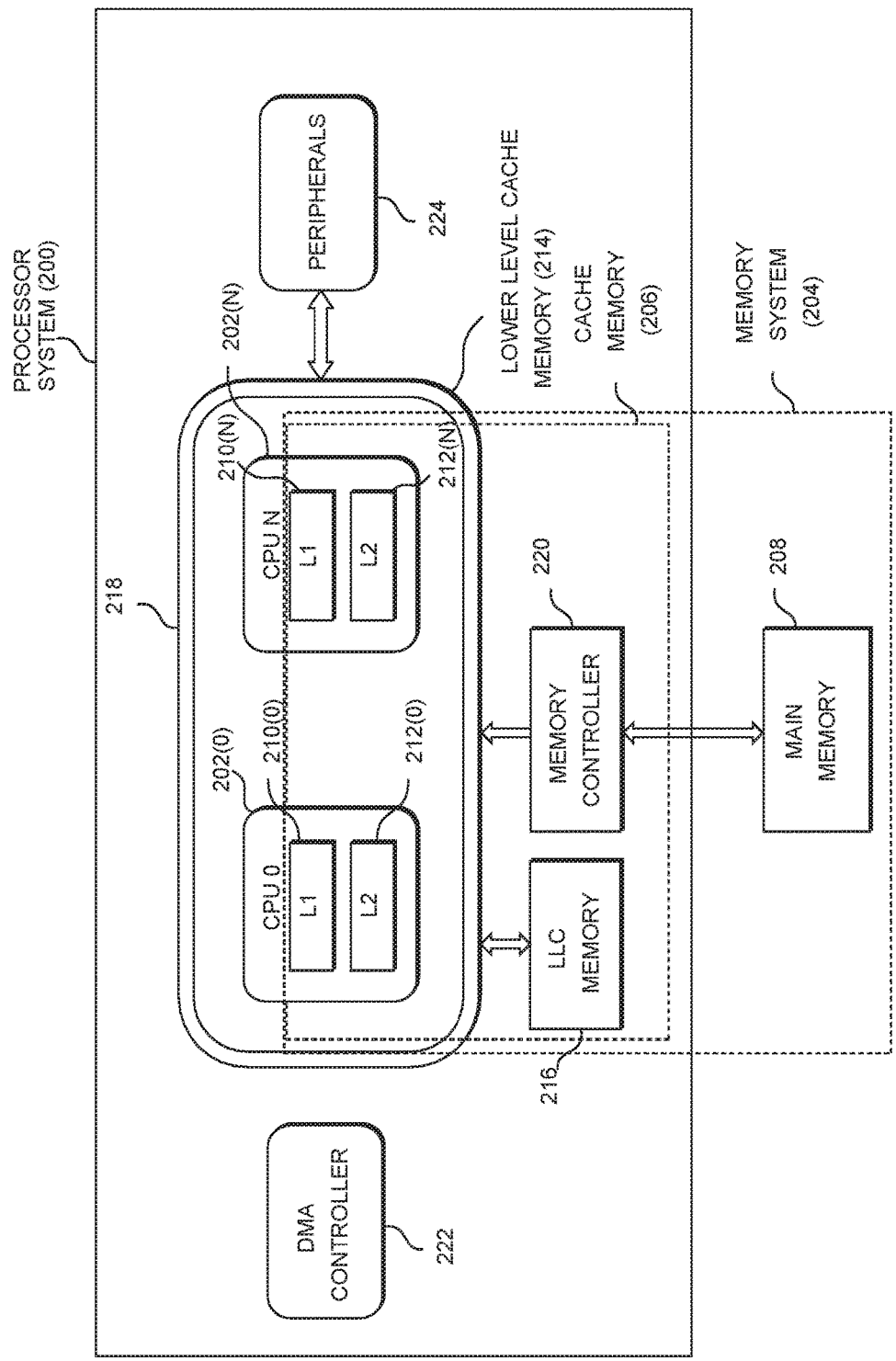
FIG. 2 is a block diagram of an exemplary processor system that includes a plurality of central processing units (CPUs) and a memory system including a cache memory and a main memory, wherein the cache memory is configured to perform data bit inversion tracking to reduce data bits written for write operations.

FIG. 2 is a block diagram of an exemplary processor system 200 that includes a plurality of central processing units (CPUs) 202(0)-202(N) and a memory system 204. The memory system 204 includes a cache memory 206 for storing cache data entries with data in a higher-level memory, such as a higher-level cache memory 226 and/or a main memory 208. The higher-level memory can include one or more memory entries, each associated with a memory address and each including a data field for storing data. In this example, the cache memory 206 includes a hierarchy of local, private cache memories 210(0)-210(N) on-chip with and accessible only to each respective CPU 202(0)-202(N), local, public cache memories 212(0)-212(N) that form a shared lower-level cache memory 214 accessible to all CPUs 202(0)-202(N), and a last level cache (LLC) memory 216. The LLC memory 216 is the last level of cache memory before a memory access reaches the main memory 208. For example, the main memory 208 may be a dynamic read access memory (DRAM). As examples, the local, private cache memories 210(0)-210(N) may be level 1 (L1) cache memories, the shared lower-level cache memory 214 may be a level 2 (L2) cache memory, and the LLC memory 216 may be a level 3 (L3) cache memory. An internal system bus 218 is provided that allows each of the CPUs 202(0)-202(N) to access the LLC memory 216 as well as other shared resources. Other shared resources that can be accessed by the CPUs 202(0)-202(N) through the internal system bus 218 can include a memory controller 220 for accessing the main memory 208, a direct memory access (DMA) controller 222, and peripherals 224. The memory controller 220, however, controls read and write operations that involve at least one of the CPUs 202(0)-202(N). When a write operation involving at least one of the CPUs 202(0)-202(N) occurs, a write request is initially sent to the cache memory 206 of the memory system 204, as illustrated in further detail in FIG. 3.

Figure 3:
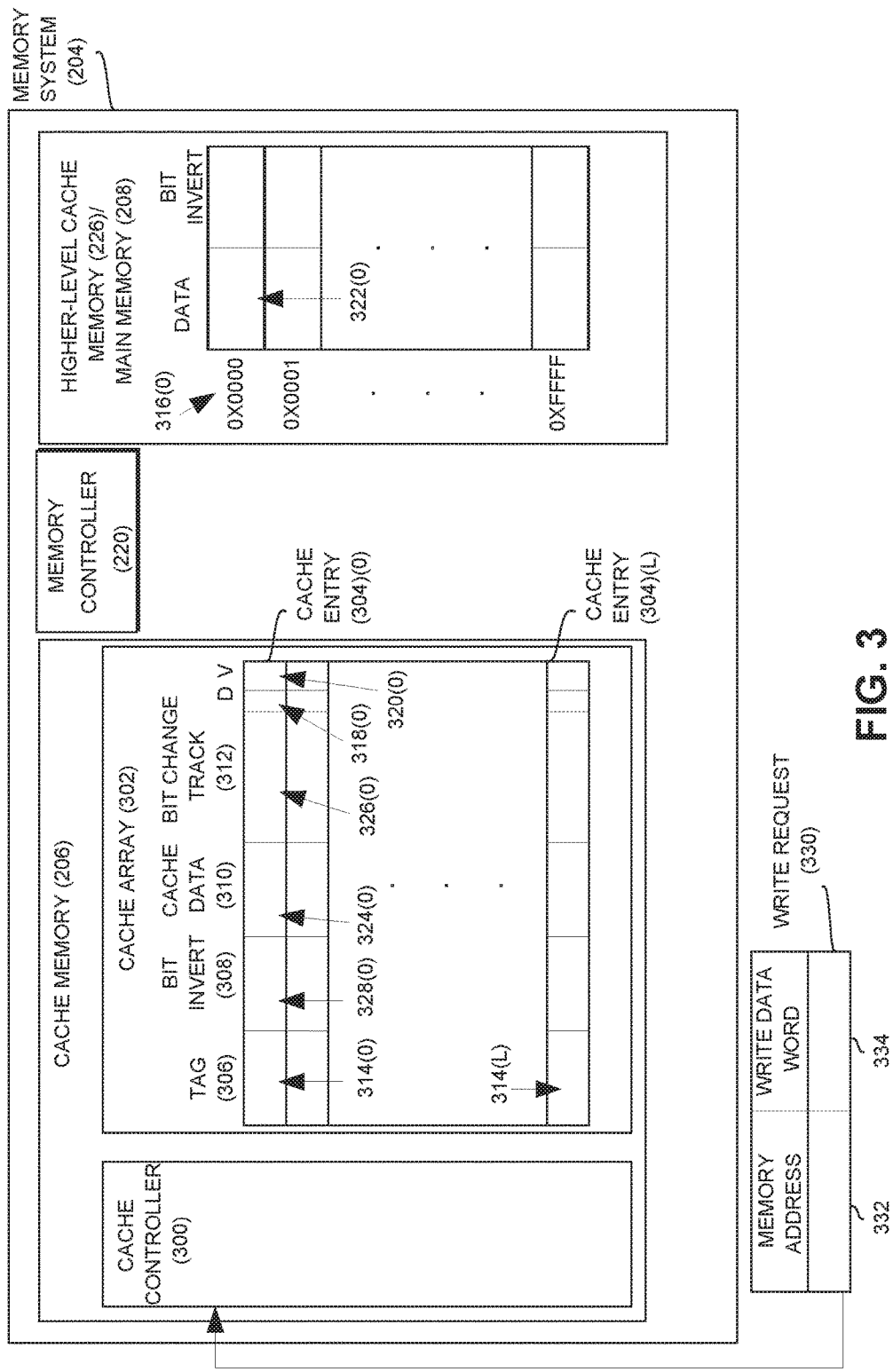
FIG. 3 is a block diagram illustrating exemplary detail of the memory system in the processor system in FIG. 2.

FIG. 3 is a block diagram illustrating exemplary detail of the memory system 204 in the processor system 200 in FIG. 2. As discussed in more detail below, the memory system 204 in FIG. 3 employs data bit inversion tracking in the cache memory 206 to reduce data bits written for write operations. The memory system 204 in FIG. 3 includes the higher-level cache memory 226 and/or the main memory 208, the cache memory 206, and the memory controller 220, as discussed above with regard to FIG. 2. The cache memory 206 includes a cache controller 300 and a cache array 302. The cache array 302 includes one or more cache entries 304(0)-304(L) for storing cached data. If the cache memory 206 is the LLC memory 216, the cache memory 206 can store cache data from the main memory 208. If the cache memory 206 is not the LLC memory 216, the cache memory 206 may store cache data from the higher-level cache memory 226 and/or directly from the main memory 208.

With continuing reference to FIG. 3, in this example, each cache entry 304(0)-304(L) includes a tag field 306, a bit invert field 308, a cache data field 310, a bit change track field 312, a dirty bit field (D), and a valid bit field (V). By using fields such as the bit change track field 312 and/or the bit invert field 308, data bit inversion tracking can be performed in the cache memory 206. In this manner, the cache memory 206 can avoid performing a read operation on the higher-level cache memory 226 and/or the main memory 208 before performing a write operation. Using cache entry 304(0) as an example, the tag field 306 in the cache entry 304(0) is configured to store memory tag 314(0) corresponding to a memory address 316(0) in the main memory 208. The dirty bit field (D) in cache entry 304(0) is configured to store a dirty bit indicator 318(0), which indicates whether or not the corresponding cache entry 304(0) has been modified since it was read from the main memory 208. The valid bit field (V) in the cache entry 304(0) is configured to store a valid bit indicator 320(0), which indicates whether or not the corresponding cache entry 304(0) has been loaded with valid data. The cache controller 300 in FIG. 3 is configured to fill each cache entry 304(0)-304(L) in the cache array 302 with data from the main memory 208 or the higher-level cache memory 226. For example, the cache controller 300 is configured to fill the cache entry 304(0) in the cache array 302 with data 322(0) if desired. The received main memory data 322(0) can be stored as cache data 324(0) in the cache entry 304(0) in the cache array 302 according to the memory address 316(0) for the main memory data 322(0). In this manner, the CPU 202 can access the cache data 324(0), also referred to as a current cache data word 324(0), stored in the cache array 302 as opposed to having to obtain the data 322(0), also referred to as a main memory data word 322(0), from the main memory 208.

It may be desired for the memory system 204 to employ a data bit inversion storage scheme to store data in the main memory 208 in an inverted form based on a bit change track word 326(0) and indicated by a bit invert indicator 328(0). Employing such a data bit inversion storage scheme in response to a write request 330 may be desired because doing so may require fewer bits to be changed from the current main memory data word 322(0) at the memory address 316(0) associated with the write request 330. If storing data in response to the write request 330 in a non-inverted form requires fewer bits to be changed at the memory address 332 associated with the write request 330 in the main memory 208, then the memory system 204 may be configured to store data in the non-inverted form. In either scenario, writing fewer bits for the write request 330 can reduce power consumption for the write operation. To determine whether it would require fewer bits to be written to write a write data word 334 of the write request 330 to the main memory 208, the bit states (i.e., whether the bit is in a '1' state or a '0' state) of the current main memory data word 322(0) at the memory address 316(0) in the main memory 208 must be known. A read operation could be performed to read the current main memory data word 322(0) at the memory address 316(0) in the main memory 208 in response to the write request 330, but doing so would require more steps and would consume more power. Thus, it is desired to be able to determine whether it would require fewer bits to be written to write a write data word for a write request to main memory in either an inverted or a non-inverted form without having to first read a current main memory data word at a memory address in main memory in response to a write request, if possible.

In this regard, as will be discussed in more detail below, the cache memory 206 in FIG. 3 is configured to perform data bit inversion tracking in the cache memory 206 itself to reduce data bits written for write requests. This can avoid first having to read the current main memory data word 322(0) from the main memory 208 to determine whether it would require fewer bits to write data to the main memory 208 for a write request in certain circumstances. In this regard, in response to the write request 330, the cache controller 300 is configured to search the memory tags 314(0)-314(L) of the cache entries 304(0)-304(L) to determine if the any of the memory tags 314(0)-314(L) correspond to the memory address 332 of the received write request 330 (i.e., a cache hit). If any of the memory tags 314(0)-314(L) correspond to the memory address 332 of the received write request 330, then the cache array 302 contains the current main memory data word 322(0) as the current cache data word 324(0) in the corresponding cache entry 304(0). The current cache data word 324(0) can thus be used to determine whether it would require fewer bits to be written to write the write data word 334 of the write request 330 in an inverted or a non-inverted form. Thus, a separate read operation to the main memory 208 is not required to determine whether it would require fewer bits to be written to write the write data word 334 of the write request 330 in the inverted or the non-inverted form.

In response to the cache hit in the cache memory 206 for the write request 330, the cache controller 300 is configured to compare the current cache data word 324(0) of the cache entry 304(0) corresponding to the memory address 332 of the write request 330 to the write data word 334 in the write request 330 to be written. This is because the cache array 302 contains the cache entry 304(0) that corresponds to the memory address 332 of the write request 330. The cache controller 300 is configured to store the bit change track word 326(0) in the bit change track field 312 in the cache entry 304(0) representing the difference (i.e., inverted bits) between the current cache data word 324(0) corresponding to the memory address 332 of the write request 330 and the write data word 334 of the write request 330. If the bit change track word 326(0) has fewer inverted bits than non-inverted bits, then writing the write data word 334 of the write request 330 back to the higher-level cache memory 226 and/or the main memory 208 in a non-inverted form may require fewer bits to be written (e.g., for a write-through or write-back operation). However, if the bit change track word 326(0) has more inverted bits than non-inverted bits, then writing the write data word 334 in the main memory 208 in an inverted form may require fewer bits to be written. By using the bit change track word 326(0) stored in the bit change track field 312 of the cache entry 304(0), for example, to determine whether fewer bit writes are required to write data in an inverted or a non-inverted form, power consumption can be reduced for write operations by reducing bit write operations.

In this regard, the bit invert indicator 328(0) can be stored in the bit invert field 308 for the corresponding cache entry 304(0) to indicate whether write data is stored in an inverted or a non-inverted form. By providing such data bit inversion tracking in the cache memory 206, the cache controller 300 can perform data bit inversion operations for write operations without having to first read data from the main memory 208 if a cache hit occurs in response to a write request. Therefore, for example, an RMW scheme can be avoided if desired for performing data bit inversion operations for write operations that result in a cache hit to the cache memory 206. Also, by providing data bit inversion tracking in the cache memory 206, a write data word stored in the cache memory 206 can be written back to the main memory 208 without having to first perform a read operation to the main memory 208. For example, the write data word 334 that can be stored in the cache memory 206 may be written back to the main memory 208 in a write-through scheme, or in response to an eviction from the cache memory 206 as part of a write-back scheme.

Figure 4:
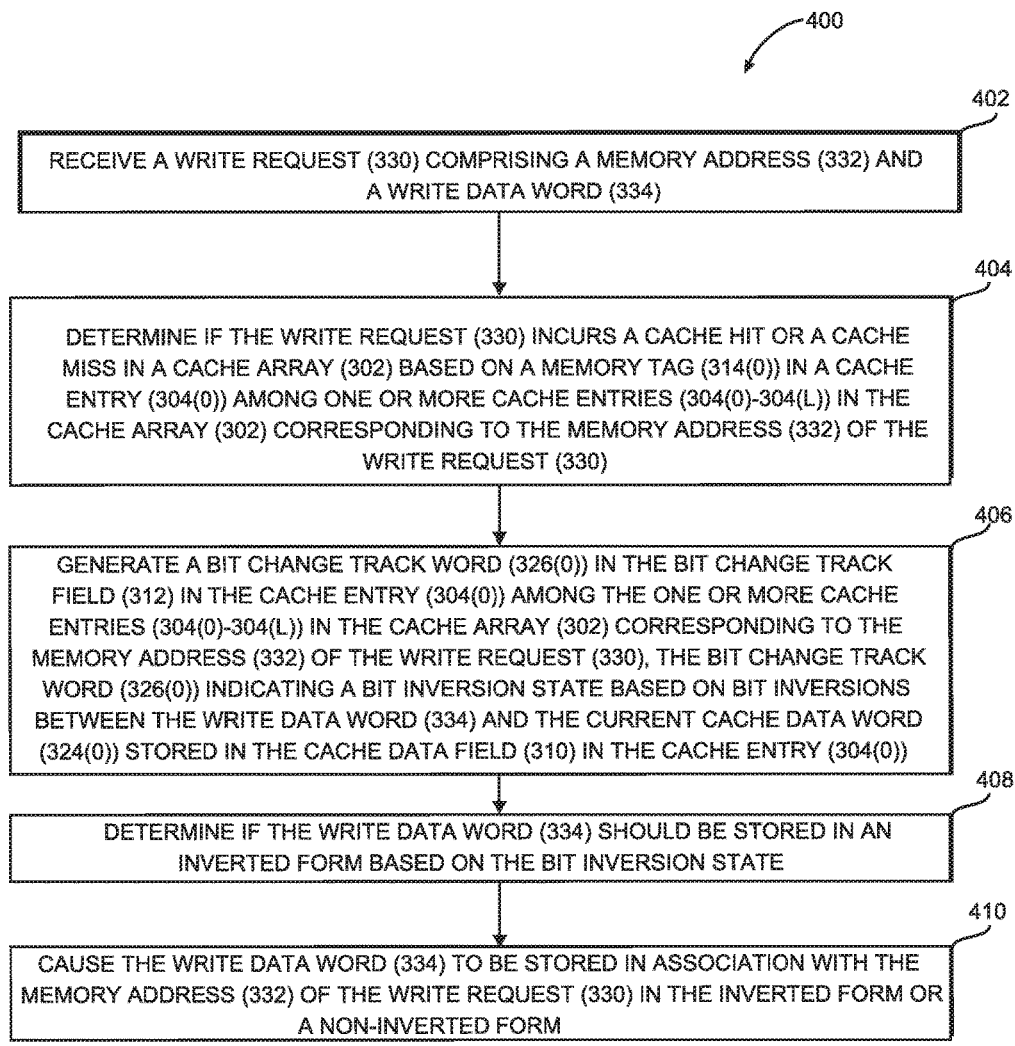
FIG. 4 is a flowchart illustrating a process of an exemplary write operation being performed in the memory system in FIG. 3 that involves data bit inversion tracking to reduce data bits written.
Figure 5A:
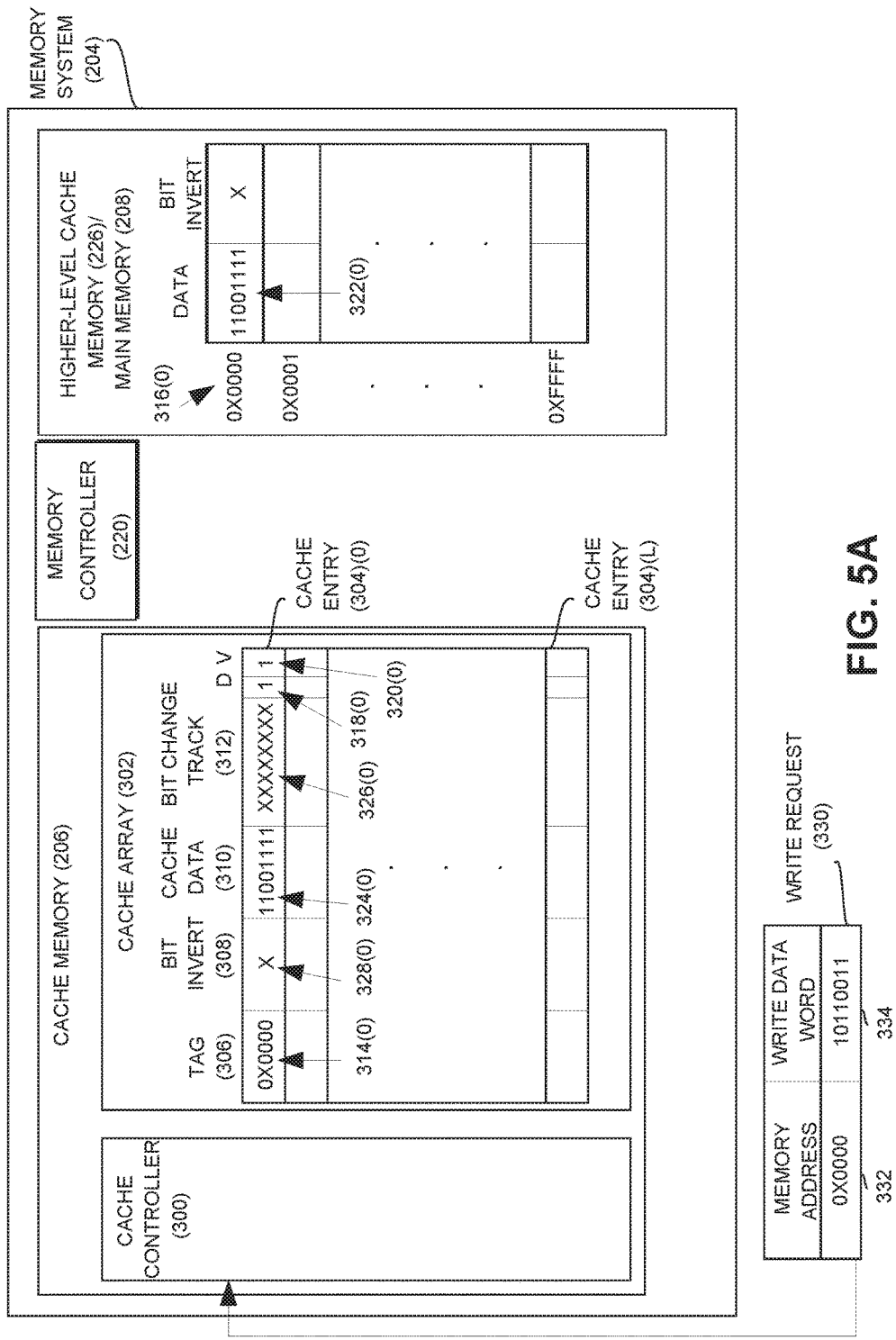
FIGS. 5A-5D are block diagrams illustrating exemplary stages of an exemplary write operation performed in the memory system in FIG. 3 that involves data bit inversion tracking to reduce data bits written.

FIG. 4 is a flowchart illustrating a process of an exemplary write operation being performed in the memory system in FIG. 3 that involves data bit inversion tracking to reduce data bits written. FIGS. 5A-5D are block diagrams illustrating exemplary stages of an exemplary write operation performed in the memory system in FIG. 3 that involves data bit inversion tracking to reduce data bits written, as discussed in FIG. 4. In this regard, FIGS. 5A-5D will be discussed in conjunction with the exemplary process 400 illustrated in FIG. 4. FIG. 5A illustrates a first step of the exemplary process 400 of receiving the write request 330 comprising the memory address 332 and the write data word 334 (block 402 in FIG. 4). As shown in FIG. 5A, the write request 330 is sent to and received by the cache controller 300, by a CPU 202 for example, to initiate a write operation in the memory system 204. Upon initiating the write operation in the memory system 204, the cache controller 300 determines if the write request 330 incurs a cache hit or a cache miss in the cache array 302 based on the memory tag 314(0) in the cache entry 304(0) among the one or more cache entries 304(0)-304(L) in the cache array 302 corresponding to the memory address 332 of the write request 330 (block 404 in FIG. 4). In this regard, a cache hit occurs if the memory address 332 of the write request 330 is found in the tag field 306 of the cache array 302 and the corresponding valid bit indicator 320(0) indicates that the corresponding cache entry 304(0) has been loaded with valid data. Alternatively, and as discussed below in further detail, a cache miss occurs if the memory address 332 of the write request 330 is not found in the tag field 306 of the cache array 302, or if the corresponding valid bit indicator 320(0) indicates that the corresponding cache entry 304(0) has not been loaded with valid data.

Figure 5B:
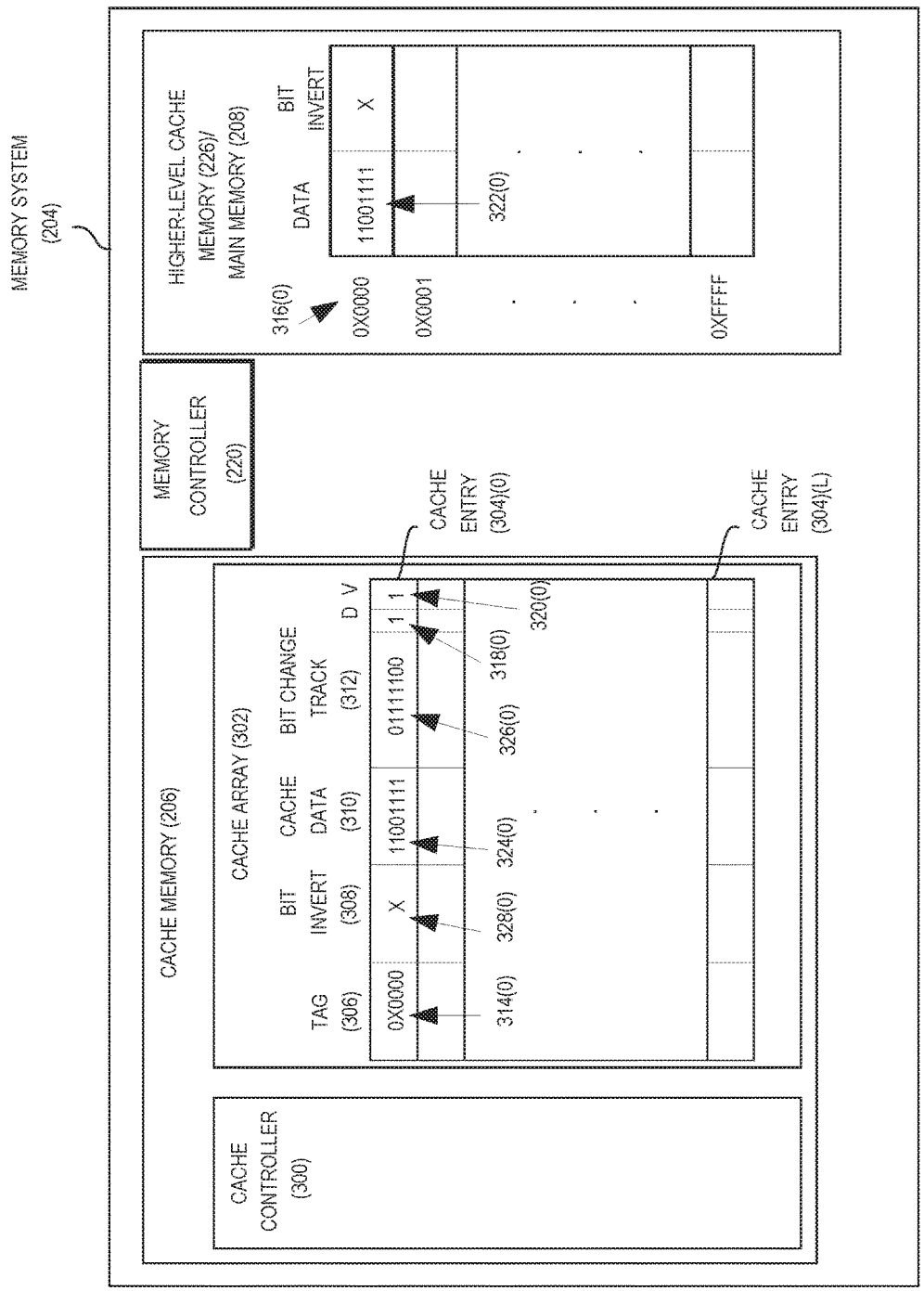

With reference to FIGS. 4, 5A, and 5B, if the write request 330 incurs a cache hit, then the cache controller 300 generates the bit change track word 326(0) in the bit change track field 312 in the cache entry 304(0) among the one or more cache entries 304(0)-304(L) in the cache array 302 corresponding to the memory address 332 of the write request 330, the bit change track word 326(0) indicating a bit inversion state based on bit inversions between the write data word 334 and the current cache data word 324(0) stored in the cache data field 310 in the cache entry 304(0) (block 406 in FIG. 4). In this example, the cache controller 300 generates the bit change track word 326(0) by performing a bit-by-bit comparison between the write data word 334 and the current cache data word 324(0).

Performing the bit-by-bit comparison includes comparing a bit in a given position in the current cache data word 324(0) to a bit in a corresponding position in the write data word 334. For example, the leftmost bit in the current cache data word 324(0) in FIG. 5A is a '1' and the leftmost bit in the write data word 334 is also a '1.' Thus, the leftmost bit in the current cache data word 324(0) in FIG. 5A is the same as the leftmost bit in the write data word 334. This means that writing the write data word 334 over the current cache data word 324(0) does not require rewriting the leftmost bit of the current cache data word 324(0). For this reason, the leftmost bit of the bit change track word 326(0) can be indicated as a '0.' In contrast, the second most significant bit (i.e., the second leftmost bit) in the current cache data word 324(0) in FIG. 5A is a '1' while the second most significant bit in the write data word 334 is a '0.' Since the second most significant bit in the current cache data word 324(0) is different from the second most significant bit in the write data word 334, writing the write data word 334 over the current cache data word 324(0) requires rewriting the second most significant bit of the current cache data word 324(0). For this reason, the second most significant bit of the bit change track word 326(0) can be indicated as a '1.' In this manner, the bit change track word 326(0) in the cache entry 304(0) indicates which bits in the current cache data word 324(0) need to be rewritten or "flipped" to write the write data word 334 over the current cache data word 324(0) at the memory location corresponding to the memory address 316(0) associated with the current cache data word 324(0). Further, since the current cache data word 324(0) should correspond to the main memory data word 322(0), the bit change track word 326(0) should also indicate which bits in the main memory data word 322(0) need to be rewritten to write the write data word 334 over the main memory data word 322(0) at the memory address 332 provided by the write request 330.

Figure 5C:
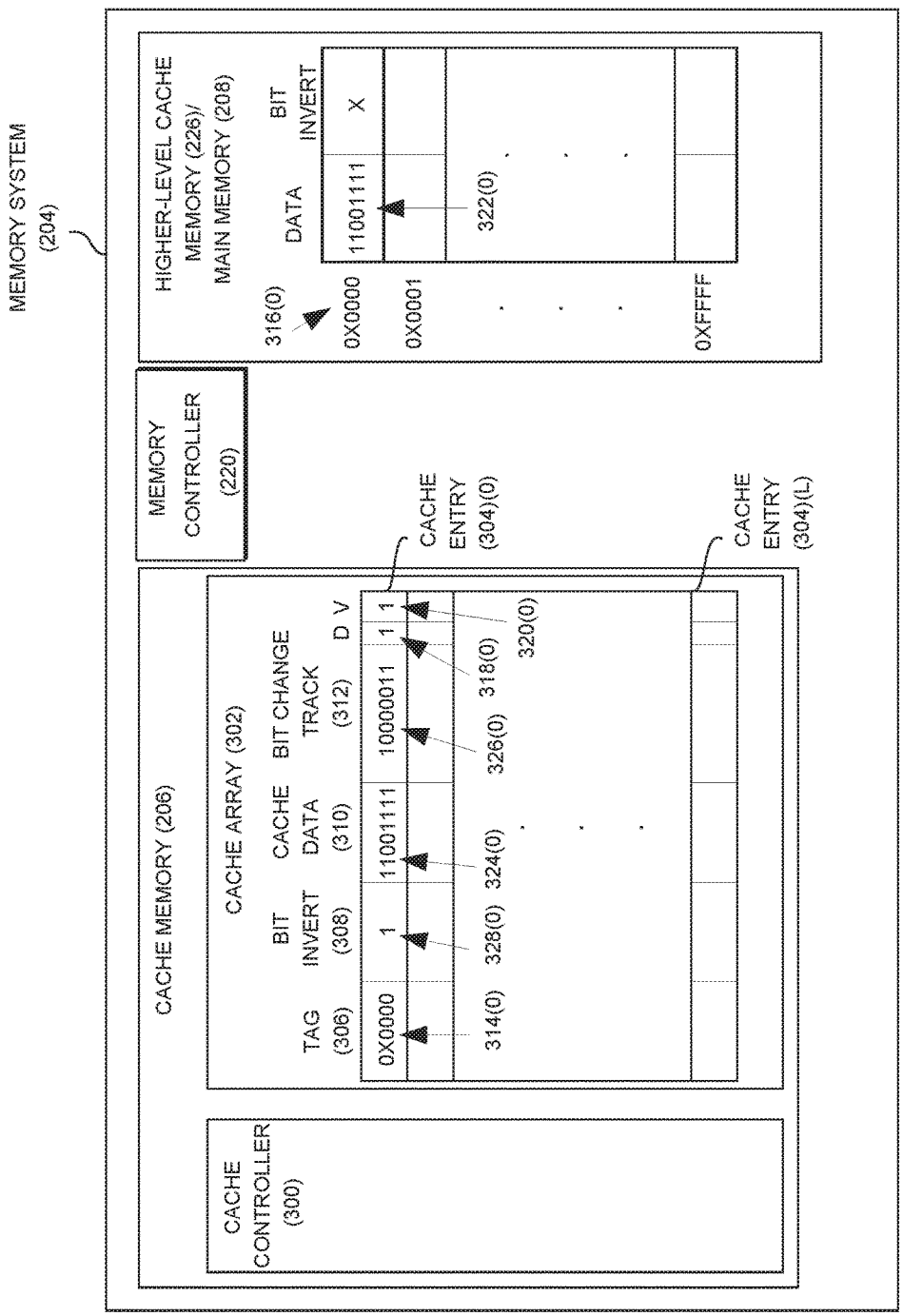
Figure 5D:
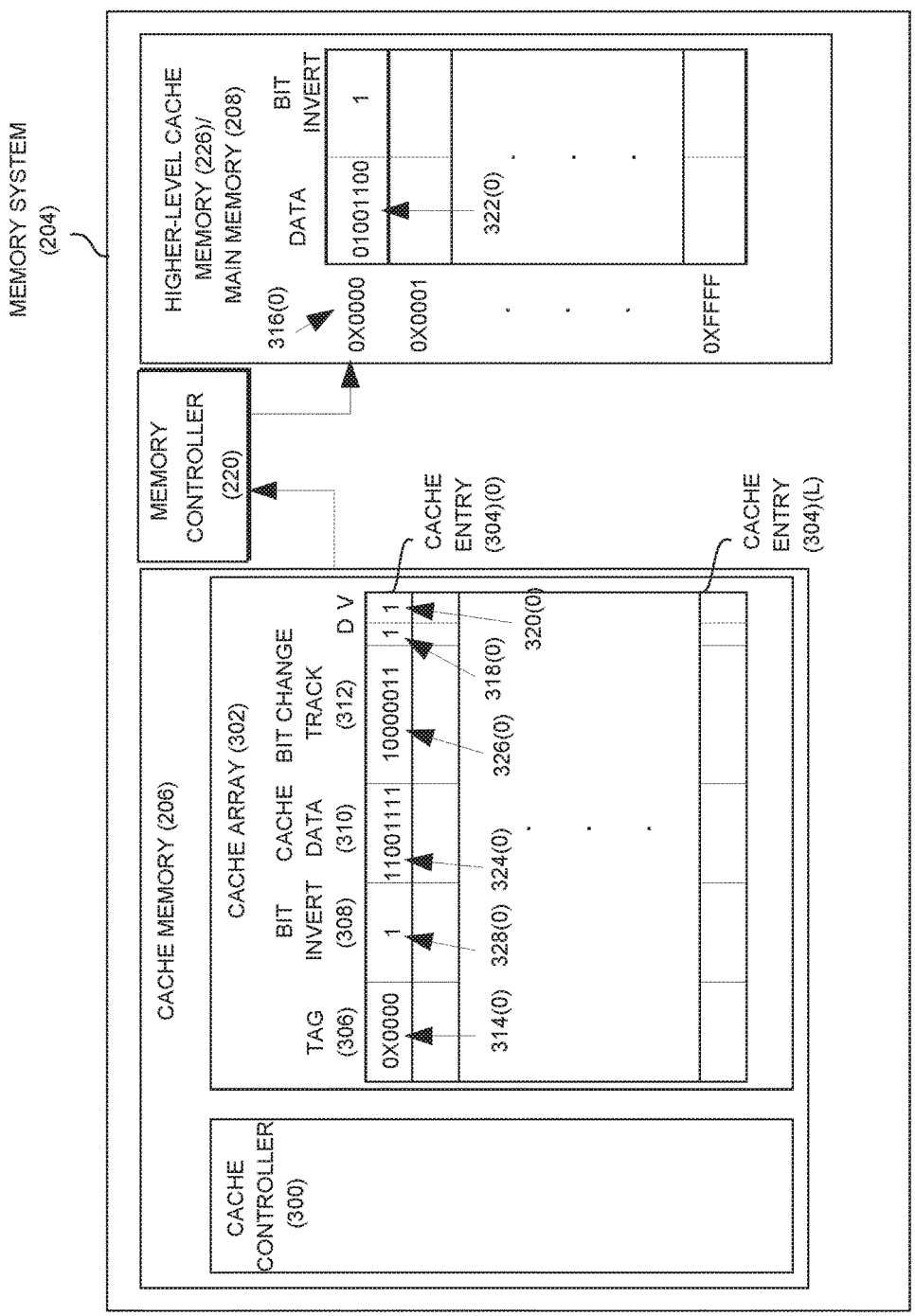

The cache controller 300 in FIGS. 5A-5D is also configured to further reduce the number of bit write operations performed in response to the write request 330 by using a bit inversion state based on the bit inversions between the write data word 334 and the current cache data word 324(0) to determine whether or not to write the write data word 334 in an inverted form or in a non-inverted form. For example, FIG. 5C illustrates the bit change track word 326(0) indicating that five bits in the current cache data word 324(0) need to be rewritten to write the write data word 334 at the memory location corresponding to the memory address 316(0) associated with the current cache data word 324(0). One way of rewriting the current cache data word 324(0) involves performing five write operations (i.e., performing a write operation for each '1' in the bit change track word 326(0) stored in the cache entry 304(0) illustrated in the cache array 302). However, another way of rewriting the current cache data word 324(0) involves only performing three write operations. This can be accomplished by performing a write operation on each bit of the current cache data word 324(0) corresponding to each '0' in the bit change track word 326(0) stored in the cache entry 304(0) illustrated in the cache array 302. Once each bit of the current cache data word 324(0) corresponding to each '0' in the bit change track word 326(0) is rewritten, the write data word 334 will have been written in an inverted form.

In this regard, the cache controller 300 is configured to determine if the write data word 334 should be stored in an inverted form based on the bit inversion state, which is based on the bit inversions between the write data word 334 and the current cache data word 324(0) (block 408 of FIG. 4). More specifically, the bit inversion state is based on the number of bit inversions (i.e., the number of bits in the current cache data word 324(0) which need to be rewritten to write the write data word 334 at the memory location corresponding to the memory address 316(0) associated with the current cache data word 324(0)), the size of the current cache data word 324(0), and the value previously stored in the bit invert field 308 (denoted as 'X'). By using these three pieces of information, the cache controller 300 can determine the bit inversion state which reduces the number of bit write operations for a given write request.

Given a current cache data word 324(0) having an even word size, in this example, there are four cases where varying the number of bit inversions, the word size of the current cache data word 324(0), and the value previously stored in the bit invert field 308 can reduce the number of bit write operations for a given write request. In a first case, if the number of bit inversions in the bit change track word 326(0) is greater than one-half the word size of the current cache data word 324(0), and the value previously stored in the bit invert field 308 is a '0' (indicating a first logical state), then writing a '1' to the bit invert field 308 and storing an inverted form of the write data word 334 would reduce the number of bit write operations for the write request 330. For example, if the write data word provided by the write request is '00000000' and the current cache data word is '00011111,' then the bit change track word would be '0001111E' Assuming that the bit invert field previously contained a '0' (which can be determined by reading the bit invert field in an earlier step), writing the write data word in a non-inverted form would require performing five bit write operations for each '1' in the bit change track word. However, writing the write data word in an inverted form would only require four bit write operations; three for each '0' in the bit change track word and one to write a '1' to the bit invert field, which previously held a '0.' In this case, where the bit invert field previously contained a '0,' the number of bit inversions in the bit change track word (five) was greater than one-half the word size (one-half of the word size of the current cache data word, eight, is a value of four). Thus, writing a '1' to the bit invert field and storing an inversion of the write data word reduces the number of bit write operations for the write request.

In a second case, if the number of bit inversions in the bit change track word 326(0) is less than or equal to one-half the word size of the current cache data word 324(0), and the value previously stored in the bit invert field 308 is a '0,' then not writing to the bit invert field 308 and storing a non-inverted form of the write data word 334 would reduce the number of bit write operations for the write request 330. For example, if the write data word provided by the write request is '00000000' and the current cache data word is '00000111,' then the bit change track word would be '0000011E' Assuming that the bit invert field previously contained a '0,' writing the write data word in a non-inverted form would require performing three bit write operations for each '1' in the bit change track word. However, writing the data word in an inverted form would require six bit write operations; five for each '0' in the bit change track word and one to write a '1' to the bit invert field, which previously held a '0.' In this case, where the bit invert field previously contained a '0,' the number of bit inversions in the bit change track word (three) was less than one-half the word size (one-half of the word size of the current cache data word, eight, is a value of four). Thus, not writing to the bit invert field and storing a non-inverted form of the write data word would reduce the number of bit write operations for the write request.

In a third case, if the number of bit inversions in the bit change track word 326(0) is greater than or equal to one-half the word size of the current cache data word 324(0), and the value previously stored in the bit invert field 308 is a '1' (indicating a second logical state), then not writing to the bit invert field 308 and storing an inverted form of the write data word 334 would reduce the number of bit write operations for the write request 330. For example, if the write data word provided by the write request is '00000000' and the current cache data word is '00001111,' then the bit change track word would be '0000111E' Assuming that the bit invert field previously contained a '1,' writing the write data word in a non-inverted form would require performing four bit write operations for each '1' in the bit change track word and one bit write operation for writing a '0' to the bit invert field— resulting in a total of five bit write operations. However, writing the write data word in an inverted form would only require performing four bit write operations; four bit write operations for each '0' in the bit change track word and no bit write operations for the bit invert field because it is already set to '1.' In this case, where the bit invert field previously contained a '1,' the number of bit inversions in the bit change track word (four) was equal to one-half the word size (one-half of the word size of the current cache data word, eight, is a value of four). Thus, not writing to the bit invert field and storing an inverted form of the write data word would reduce the number of bit write operations for the write request.

In a fourth case, if the number of bit inversions in the bit change track word 326(0) is less than one-half the word size of the current cache data word 324(0), and the value previously stored in the bit invert field 308 is a '1,' then writing to the bit invert field 308 and storing a non-inverted form of the write data word 334 would reduce the number of bit write operations for the write request 330. For example, if the write data word provided by the write request is '00000000' and the current cache data word is '00000111,' then the bit change track word would be '0000011E' Assuming that the bit invert field previously contained a '1,' writing the write data word in a non-inverted form would require performing three bit write operations for each '1' in the bit change track word and one bit write operation for writing a '0' to the bit invert field—resulting in a total of four bit write operations. However, writing the write data word in an inverted form would require performing a total of five bit write operations; four bit write operations for each '0' in the bit change track word and no bit write operations for the bit invert field because it is already set to '1.' In this case, where the bit invert field previously contained a '1,' the number of bit inversions in the bit change track word (three) was less than one-half the word size (one-half of the word size of the current cache data word, eight, is a value of four). Thus, writing a '0' to the bit invert field and storing a non-inverted form of the write data word would reduce the number of bit write operations for the write request. Aspects disclosed herein can also be applied to odd word sizes. However, in the case of odd word sizes, algorithms for reducing the number of bit write operations for a given write request may be different from those discussed above with regard to even word sizes.

In each of the above four cases, the cache controller 300 is configured to determine if the write data word 334 should be stored in an inverted form based on the number of bit inversions, the size of the current cache data word 324(0), and the value previously stored in the bit invert field 308. By using these three pieces of information, the cache controller 300 is able to determine the bit inversion state which reduces the number of bit write operations for a given write request.

With further respect to FIG. 4 and FIGS. 5A-5D, the cache controller 300 is also configured to cause the write data word 334 to be stored in association with the memory address 332 of the write request 330 in the inverted form or the non-inverted form (block 410 in FIG. 4). As discussed above, once an inversion state which reduces the number of bit write operations for the write request 330 is determined, the write data word 334 is ready to be written to the memory location associated with the memory address 332 of the write request 330. The memory location associated with the memory address 332 of the write request 330 can include the main memory data field containing the main memory data word 322(0) in the main memory 208. In this regard, the write data word 334 can be written to the main memory 208 when evicted as part of a write-back scheme without having to first perform a read operation on the main memory 208. Alternatively, the write data word 334 can be written to the main memory 208 as part of a write-through scheme. The memory location associated with the memory address 332 of the write request 330 can also include a cache entry, such as the cache entry 304(0) in FIGS. 5A-5D, among the one or more cache entries 304(0)-304(L) in the cache array 302 in the cache memory 206. In this manner, write operations performed at the cache array 302 can also be optimized. Other memory locations, such as L1, L2, LLC cache, etc. may also benefit from the above discussed reduction in the number of bit write operations performed in response to a given write request.

In the case of a cache miss occurring, the current main memory data word 322(0) may not be included in the cache memory 206, which means that the process discussed above would not have the data necessary to determine whether to store the write data word 334 in the inverted or the non-inverted form. Therefore, the cache controller 300, in conjunction with the memory controller 220, may be configured to first read in data from the main memory 208 in response to a cache miss occurring. For example, if the memory address 332 of the write request 330 corresponds to the main memory data word 322(0), the cache controller 300 can read the main memory data word 322(0) into the cache memory 206 before performing the data bit comparison operation discussed above. Thus, by employing data bit inversion tracking in cache memory, the number of data bits written for write operations can be reduced to reduce power consumption.

Figure 6:
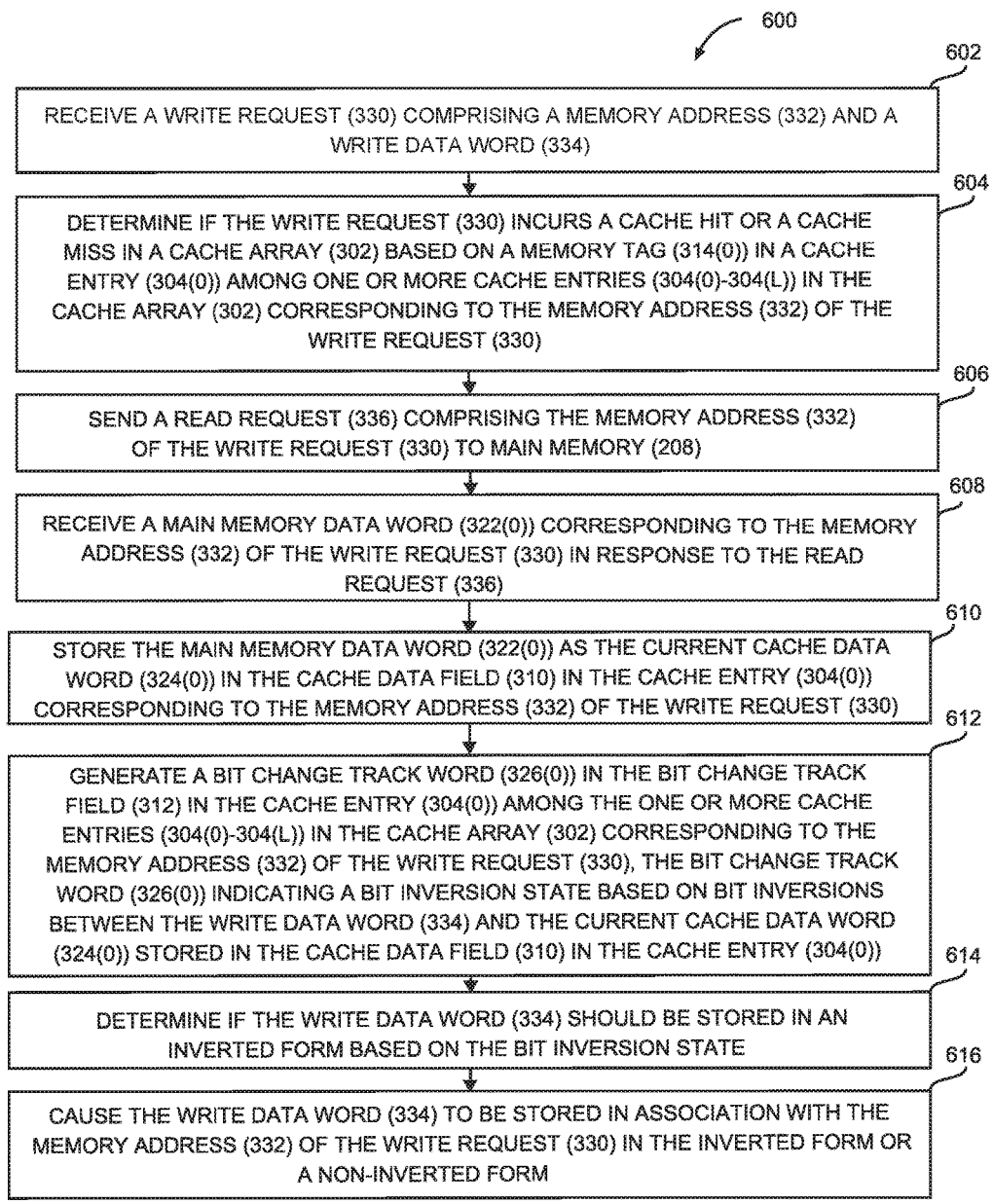
FIG. 6 is a flowchart illustrating another process of an exemplary write operation being performed in the memory system in FIG. 3 in response to a cache miss that also involves data bit inversion tracking to reduce data bits written.
Figure 7A:
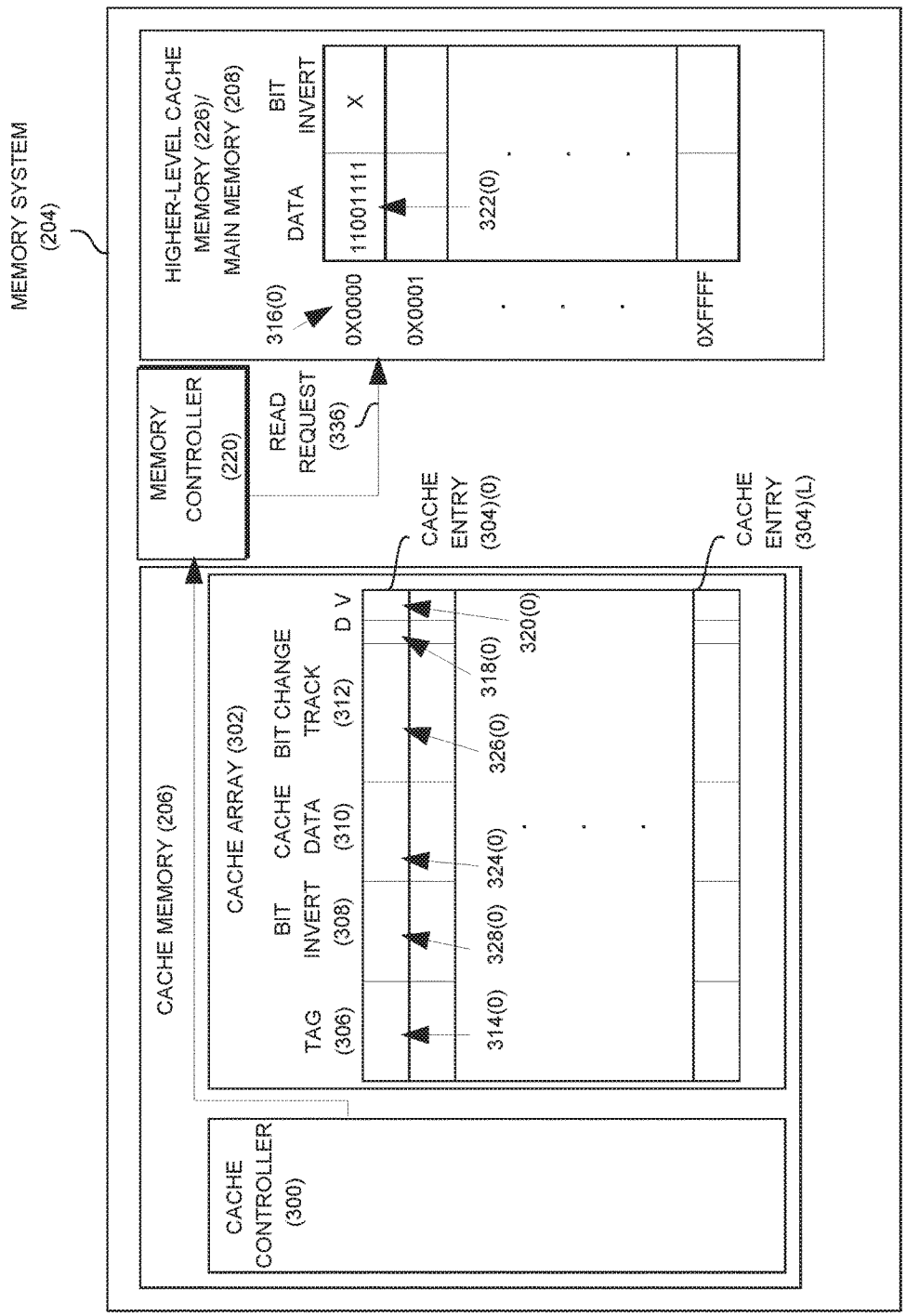
FIGS. 7A-7C are block diagrams illustrating exemplary stages of an exemplary write operation being performed in the memory system in FIG. 3 in response to a cache miss that also involves data bit inversion tracking to reduce data bits written.
Figure 7B:
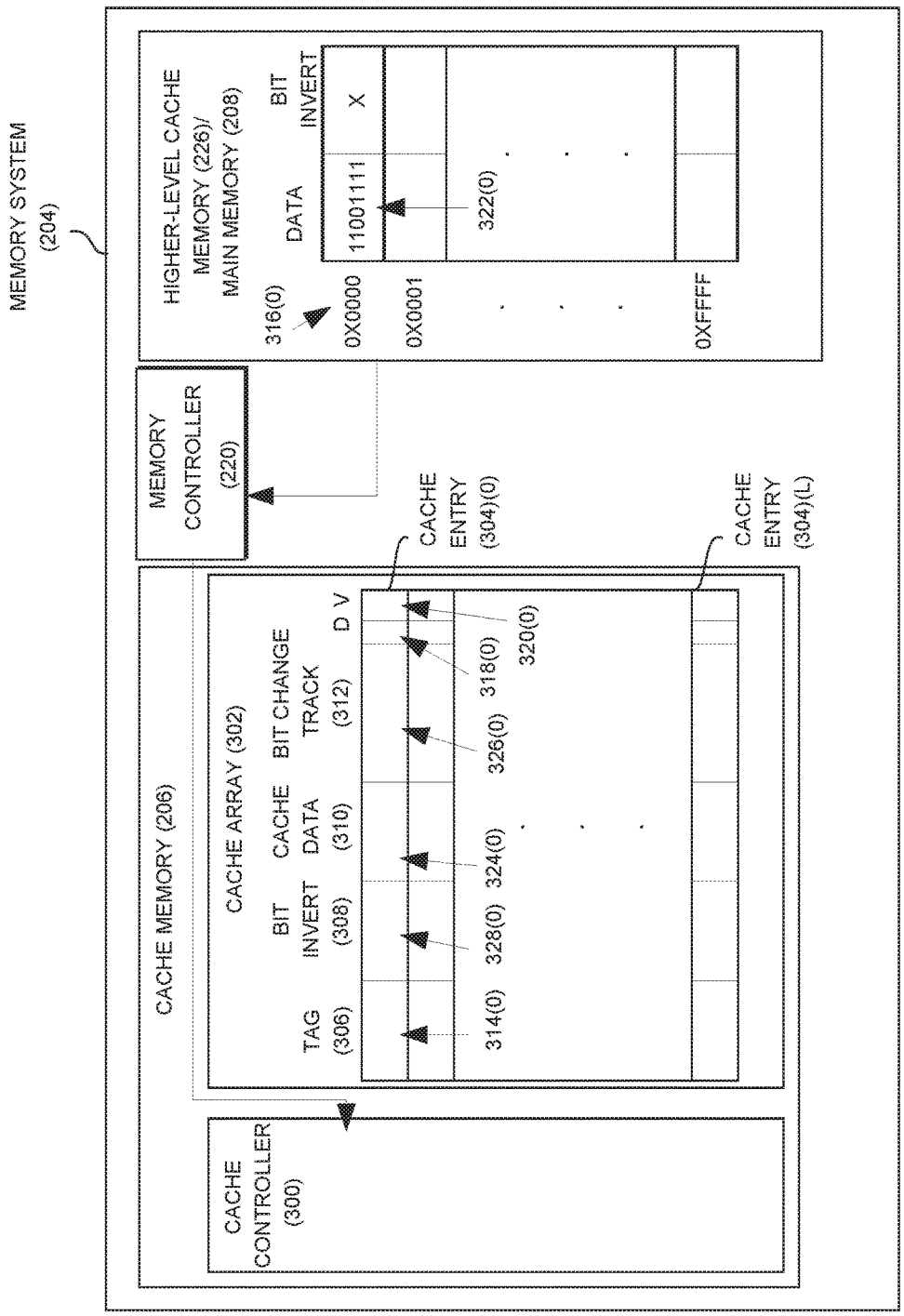
Figure 7C:
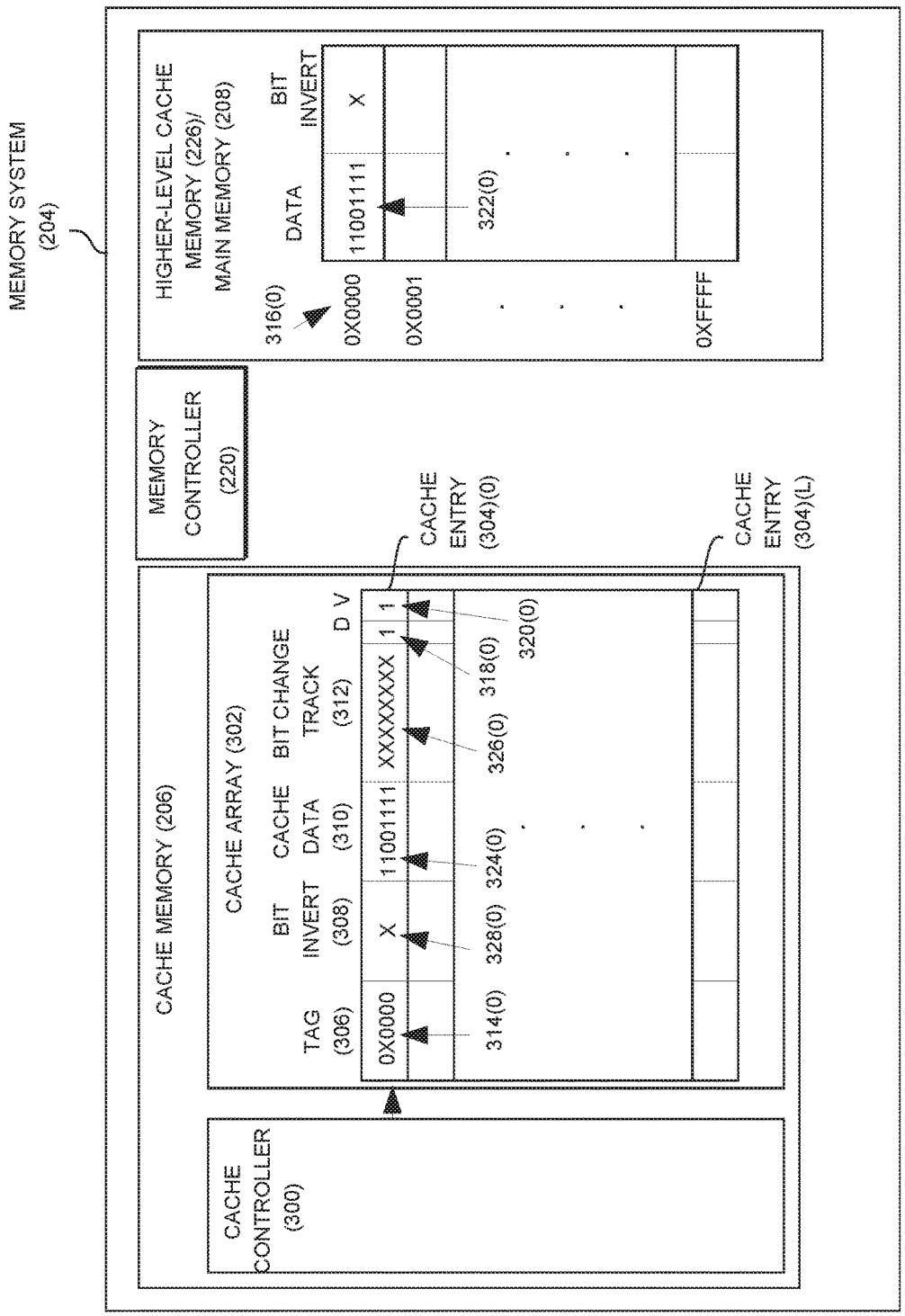

In this regard, FIG. 6 is a flowchart illustrating another process of an exemplary write operation being performed in the memory system in FIG. 3 in response to a cache miss that also involves data bit inversion tracking to reduce data bits written. FIGS. 7A-7C are block diagrams illustrating exemplary stages of an exemplary write operation being performed in the memory system in FIG. 3 in response to a cache miss that also involves data bit inversion tracking to reduce data bits written, as discussed in FIG. 6. In this regard, FIGS. 7A-7C will be discussed in conjunction with the exemplary process 600 illustrated in FIG. 6. FIG. 6 is similar to FIG. 4, however, FIG. 6 includes additional steps 606, 608, and 610 which respond to incurring a cache miss. FIGS. 7A-7C are similar to FIGS. 5A-5C, however, FIGS. 7A-7C include additional process stages which respond to incurring a cache miss. In this regard, FIG. 7A illustrates sending a read request 336 comprising the memory address 332 of the write request 330 to the main memory 208 (block 606 in FIG. 6). As shown in FIG. 7B, the cache controller 300 then receives a main memory data word, such as the main memory data word 322(0) corresponding to the memory address 332 of the write request 330 in response to the read request 336 (block 608 in FIG. 6). As further illustrated in FIG. 7C, the cache controller 300 then stores the main memory data word 322(0) as the current cache data word 324(0) in the cache data field 310 in the cache entry 304(0) corresponding to the memory address 332 of the write request 330 (block 610 in FIG. 6). Thus, the memory system 204 can respond to a cache miss by performing the above steps.

While the aspects discussed above have been applied to a binary digital logic number system, aspects disclosed herein may also apply to digital logic number systems of varying bases, such as ternary, quaternary, quinary, senary, septenuary, octal, decimal, duo-decimal, and/or hexadecimal, as non-limiting examples. Further, the above processes and configurations may be performed at varying devices in a processor system and may be performed or configured through hard-coded logic and/or software. Aspects also include using exclusive OR (XOR) gates or any combination of logic gates, such as AND, NAND, OR, NOR, NOT, and/or XNOR, or logic which can be configured to perform such logical operations, such as in a field programmable gate array (FPGA), to perform processes such as determining if the write data word 334 should be stored in an inverted form based on the bit inversion state. Aspects disclosed herein also include generating an ECC for the write data based on the bit inversion state as discussed above. In this regard, generating and decoding an ECC can include error-detecting code (EDC)/ECC (EDC/ECC) techniques and ECC/ECC techniques. ECC words generated as a consequence of such techniques can be stored or decoded in association with the memory address 332 of the write request 330, as illustrated in FIG. 3. Such aspects may also be included in system-on-a-chip (SoC) and/or IC implementations.

In another aspect, a cache memory is provided that includes a means for storing cache data in one or more cache entries each including a data field and a bit change track field. The means for storing the cache data can include the cache array 302 in FIGS. 3, 5A-5D, and 7A-7C, as non-limiting examples. The cache memory provided in this example also includes a means for writing cache data in the one or more cache entries of the means for storing the cache data. The means for writing the cache data can include the cache controller 300 in FIGS. 3, 5A-5D, and 7A-7C, as non-limiting examples. The means for writing the cache data also can include a means for receiving a write request including a memory address and a write data word. The means for receiving the write request can include the cache controller 300 in FIGS. 3, 4A-4D, and 7A-7C, as non-limiting examples, or an input therein. The means for writing the cache data also can include a means for generating a bit change track word, and can include the cache controller 300 in FIGS. 3, 5A-5D, and 7A-7C, as non-limiting examples, or logic for generating a bit change track word therein. The means for writing the cache data also can include a means for determining if the write data word is to be stored in an inverted form based on the bit inversion state, and can include the cache controller 300 in FIGS. 3, 5A-5D, and 7A-7C, as non-limiting examples, or logic for determining if the write data word is to be stored in an inverted form therein. The means for writing the cache data also can include a means for causing the write data word to be stored in association with the memory address of the write request in the inverted form. The means for causing the write data word to be stored in association with the memory address of the write request in the inverted form can include the cache controller 300 in FIGS. 3, 5A-5D, and 7A-7C, and the memory controller 220 in FIGS. 2, 3, 5A-5D, and 7A-7C, as non-limiting examples.

Data bit inversion tracking in cache memory to reduce data bits written for write operations according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
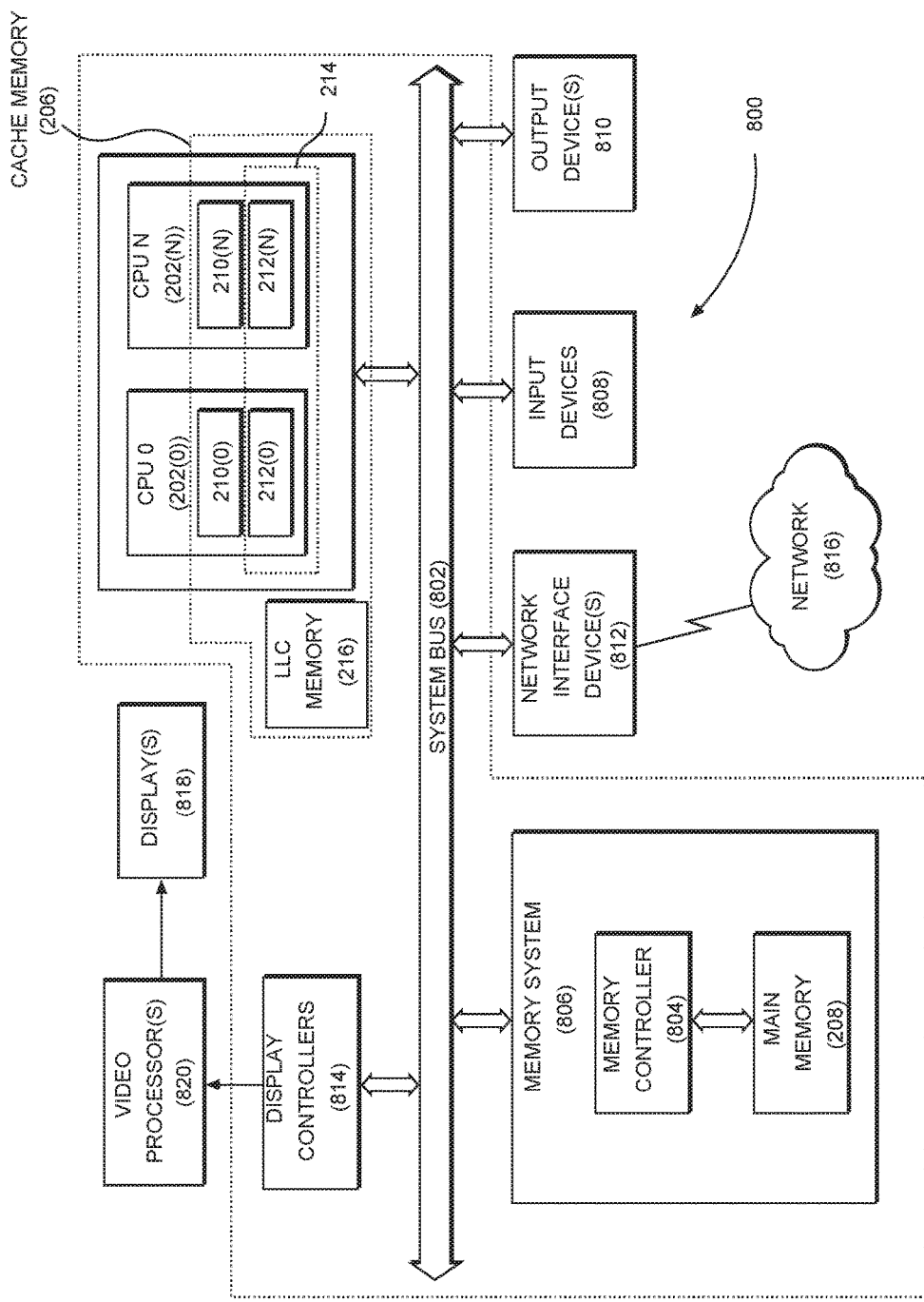
FIG. 8 is a block diagram of an exemplary processor-based system that can include the memory system of FIG. 3, including a cache controller configured to perform data bit inversion tracking to reduce data bits written for write operations.

In this regard, FIG. 8 illustrates an example of a processor-based system 800 that can employ the memory system 204 of FIG. 3, including the cache controller 300 configured to compare the current cache data word 324(0) to the write data word 334 to be written to the main memory 208 and write the write data word 334 to the main memory 208 in either an inverted or a non-inverted form based on the above comparison to reduce data bits written for write operations. In this example, the processor-based system 800 includes one or more central processing units (CPUs) 202(0)-202(N), each including one or more processors. The CPU(s) 202(0)-202(N) may be in a cache memory 206. The CPU(s) 202(0)-202(N) may have cache memory 206 coupled to the processor(s) for rapid access to temporarily stored data. The CPU(s) 202(0)-202(N) is coupled to a system bus 802 and can intercouple master and slave devices included in the processor-based system 800. The system bus 802 may be a bus interconnect like the internal system bus 218 illustrated in FIG. 2. As is well known, the CPU(s) 202(0)-202(N) communicates with these other devices by exchanging address, control, and data information over the system bus 802. For example, the CPU(s) 202(0)-202(N) can communicate bus transaction requests to a memory controller 804 as an example of a slave device. Although not illustrated in FIG. 8, multiple system buses 802 could be provided, wherein each system bus 802 constitutes a different fabric.

Other master and slave devices can be connected to the system bus 802. As illustrated in FIG. 8, these devices can include a memory system 806, one or more input devices 808, one or more output devices 810, one or more network interface devices 812, and one or more display controllers 814, as examples. The input device(s) 808 can include any type of input device, including, but not limited to, input keys, switches, voice processors, etc. The output device(s) 810 can include any type of output device, including, but not limited to, audio, video, other visual indicators, etc. The network interface device(s) 812 can be any device(s) configured to allow exchange of data to and from a network 816. The network 816 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 812 can be configured to support any type of communications protocol desired. The memory system 806 can include the main memory 208.

The CPU(s) 202(0)-202(N) may also be configured to access the display controller(s) 814 over the system bus 802 to control information sent to one or more displays 818. The display controller(s) 814 sends information to the display(s) 818 to be displayed via one or more video processors 820, which process the information to be displayed into a format suitable for the display(s) 818. The display(s) 818 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices, and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A cache memory, comprising:
   a cache array comprising one or more cache entries, each comprising a cache data field and a bit change track field; and
   a cache controller configured to write data in the one or more cache entries of the cache array;
   the cache controller configured to:
   receive a write request comprising a memory address and a write data word;
   generate a bit change track word in the bit change track field in a cache entry among the one or more cache entries in the cache array corresponding to the memory address of the write request, the bit change track word indicating a bit inversion state based on bit inversions determined by a comparison between the write data word and a current cache data word stored in the cache data field in the cache entry;
   determine if the write data word is to be stored in an inverted form based on the bit inversion state; and
   responsive to determining that the write data word is to be stored in the inverted form, cause the write data word to be stored in association with the memory address of the write request in the inverted form.

2. The cache memory of claim 1, wherein the cache controller is further configured to, responsive to determining that the write data word is not to be stored in the inverted form, cause the write data word to be stored in association with the memory address of the write request in a non-inverted form.

3. The cache memory of claim 1, wherein:
   each of the one or more cache entries in the cache array further comprises a bit invert field configured to store a bit invert indicator indicating an inversion state;
   the cache controller is further configured to set the bit invert indicator in the bit invert field in the cache entry corresponding to the memory address of the write request based on the bit inversion state of the bit change track word; and
   the cache controller is configured to:
   determine if the write data word is to be stored in the inverted form based on the inversion state of the bit invert indicator; and
   responsive to determining that the write data word is to be stored in the inverted form, cause the write data word to be stored in association with the memory address of the write request in the inverted form.

4. The cache memory of claim 3, wherein the cache controller is configured to, responsive to determining that the write data word is not to be stored in the inverted form, cause the write data word to be stored in association with the memory address of the write request in a non-inverted form.

5. The cache memory of claim 1, wherein each cache entry of the one or more cache entries in the cache array further comprises a tag field configured to store a memory tag;
- wherein the cache controller is further configured to determine if the write request incurs a cache hit or a cache miss in the cache array based on the memory tag in the cache entry among the one or more cache entries in the cache array corresponding to the memory address of the write request; and
- responsive to the occurrence of a cache hit in the cache array for the write request, the cache controller is configured to:
  - generate the bit change track word in the bit change track field in the cache entry among the one or more cache entries in the cache array corresponding to the memory address of the write request, the bit change track word indicating the bit inversion state based on the bit inversions between the write data word and the current cache data word stored in the cache data field in the cache entry;
  - determine if the write data word is to be stored in the inverted form based on the bit inversion state; and
  - responsive to determining that the write data word is to be stored in the inverted form, cause the write data word to be stored in association with the memory address of the write request in the inverted form.

6. The cache memory of claim 5, wherein responsive to the occurrence of the cache miss in the cache array for the write request, the cache controller is further configured to:
- send a read request comprising the memory address of the write request to a higher-level memory;
- receive a higher-level data word corresponding to the memory address of the write request in response to the read request; and
- store the higher-level data word as the current cache data word in the cache data field in the cache entry corresponding to the memory address of the write request.

7. The cache memory of claim 6, wherein responsive to storing the higher-level data word as the current cache data word in the cache data field in the cache entry corresponding to the memory address of the write request, the cache controller is further configured to:
- generate the bit change track word in the bit change track field in the cache entry among the one or more cache entries in the cache array corresponding to the memory address of the write request, the bit change track word indicating the bit inversion state based on the bit inversions between the write data word and the current cache data word stored in the cache data field in the cache entry;
- determine if the write data word is to be stored in the inverted form based on the bit inversion state; and
- responsive to determining that the write data word is to be stored in the inverted form, cause the write data word to be stored in association with the memory address of the write request in the inverted form.

8. The cache memory of claim 1, wherein the cache controller is configured to cause the write data word to be stored in the cache entry in the cache array associated with the memory address of the write request in the inverted form.

9. The cache memory of claim 1, wherein the cache controller is further configured to write-back the write data word to a higher-level memory in association with the memory address of the write request in the inverted form.

10. The cache memory of claim 1, wherein the cache controller is further configured to write-through the write data word to a higher-level memory in association with the memory address of the write request in the inverted form.

11. The cache memory of claim 1, wherein the cache controller is further configured to, responsive to determining that the write data word is to be stored in the inverted form:
- generate an error-correcting code (ECC) for the write data word based on the inverted form of the write data word; and
- cause the ECC to be stored in association with the memory address of the write request.

12. The cache memory of claim 2, wherein the cache controller is further configured to, responsive to determining that the write data word is to be stored in the non-inverted form:
- generate an error-correcting code (ECC) word for the write data word based on the non-inverted form of the write data word; and
- cause the ECC word to be stored in association with the memory address of the write request.

13. The cache memory of claim 6, wherein the cache controller is further configured to, in response to the read request:
- receive a higher-level error-correcting code (ECC) word corresponding to the memory address of the write request; and
- decode the received higher-level ECC word associated with the received higher-level data word.

14. The cache memory of claim 1, wherein the cache controller is configured to cause the write data word to be stored in association with the memory address of the write request in the inverted form based on a number of the bit inversions indicated in the bit change track word in the bit change track field, the number of the bit inversions being at least one-half a number of bits of the write data word.

15. The cache memory of claim 1, wherein the cache controller is configured to:
- determine a number of the bit inversions in the bit change track word stored in the bit change track field in the cache entry in the cache array; and
- responsive to determining that the number of the bit inversions in the bit change track word is greater than one-half a number of bits of the write data word, cause the write data word to be stored in association with the memory address of the write request in the inverted form;
- responsive to determining that the number of the bit inversions in the bit change track word is less than or equal to one-half the number of bits of the write data word, cause the write data word to be stored in association with the memory address of the write request in a non-inverted form.

16. The cache memory of claim 1, wherein the cache controller is configured to:
- determine a number of the bit inversions in the bit change track word stored in the bit change track field in the cache entry in the cache array; and
- responsive to determining that the number of the bit inversions in the bit change track word is greater than or equal to one-half a number of bits of the write data word, cause the write data word to be stored in association with the memory address of the write request in the inverted form;
- responsive to determining that the number of the bit inversions in the bit change track word is less than one-half the number of bits of the write data word, cause the write data word to be stored in association with the memory address of the write request in a non-inverted form.

17. The cache memory of claim 3, wherein the cache controller is configured to:
read the bit invert indicator stored in the bit invert field in the cache entry corresponding to the memory address of the write request;
determine whether the bit invert indicator indicates a first logic state or a second logic state;
determine a number of the bit inversions in the bit change track word stored in the bit change track field in the cache entry in the cache array; and
responsive to determining that the bit invert indicator indicates the first logic state and that the number of the bit inversions in the bit change track word is greater than one-half a number of bits of the write data word, set the bit invert indicator in the bit invert field to indicate the second logic state and cause the write data word to be stored in association with the memory address of the write request in the inverted form;
responsive to determining that the bit invert indicator indicates the first logic state and that the number of the bit inversions in the bit change track word is less than or equal to one-half the number of bits of the write data word, cause the write data word to be stored in association with the memory address of the write request in a non-inverted form;
responsive to determining that the stored bit invert indicator indicates the second logic state and that the number of the bit inversions in the bit change track word is greater than or equal to one-half the number of bits of the write data word, cause the write data word to be stored in association with the memory address of the write request in the inverted form;
responsive to determining that the stored bit invert indicator indicates the second logic state and that the number of the bit inversions in the bit change track word is less than one-half the number of bits of the write data word, set the bit invert indicator in the bit invert field to indicate the first logic state and cause the write data word to be stored in association with the memory address of the write request in the non-inverted form.

18. The cache memory of claim 1 integrated into an integrated circuit (IC).

19. The cache memory of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

20. A cache memory, comprising:
a means for storing cache data in one or more cache entries each comprising a data field and a bit change track field; and
a means for writing cache data in the one or more cache entries of the means for storing cache data;

the means for writing cache data comprising:
a means for receiving a write request comprising a memory address and a write data word;
a means for generating a bit change track word in the bit change track field in a cache entry among the one or more cache entries in the means for storing cache data corresponding to the memory address of the write request, the bit change track word indicating a bit inversion state based on bit inversions determined by a comparison between the write data word and a current data word stored in the data field in the cache entry;
a means for determining if the write data word is to be stored in an inverted form based on the bit inversion state; and
responsive to determining that the write data word is to be stored in the inverted form, a means for causing the write data word to be stored in association with the memory address of the write request in the inverted form.

21. A method of storing data in response to a write operation, comprising:
receiving a write request comprising a memory address and a write data word;
comparing the write data word to a current cache data word stored in a cache data field in a cache entry among one or more cache entries in a cache array corresponding to the memory address of the write request;
generating a bit change track word in a bit change track field of the cache entry, the bit change track word indicating a bit inversion state based on bit inversions determined by the comparing;
determining if the write data word is to be stored in an inverted form based on the bit inversion state; and
responsive to determining that the write data word is to be stored in the inverted form, causing the write data word to be stored in association with the memory address of the write request in the inverted form.

22. The method of claim 21, further comprising, responsive to determining that the write data word is not to be stored in the inverted form, causing the write data word to be stored in association with the memory address of the write request in a non-inverted form.

23. The method of claim 21, further comprising:
setting a bit invert indicator stored in a bit invert field in the cache entry to indicate an inversion state corresponding to the memory address of the write request based on the bit inversion state of the bit change track word;
determining if the write data word is to be stored in the inverted form based on the inversion state of the bit invert indicator; and
responsive to determining that the write data word is to be stored in the inverted form, causing the write data word to be stored in association with the memory address of the write request in the inverted form.

24. The method of claim 21, wherein each cache entry of the one or more cache entries in the cache array further comprises a tag field configured to store a memory tag, further comprising:
determining if the write request incurs a cache hit or a cache miss in the cache array based on a memory tag in a cache entry among the one or more cache entries in the cache array corresponding to the memory address of the write request; and
responsive to the occurrence of a cache hit in the cache array for the write request:

generating the bit change track word in the bit change track field in the cache entry among the one or more cache entries in the cache array corresponding to the memory address of the write request, the bit change track word indicating the bit inversion state based on the bit inversions between the write data word and the current cache data word stored in the cache data field in the cache entry;

determining if the write data word is to be stored in the inverted form based on the bit inversion state; and responsive to determining that the write data word is to be stored in the inverted form, causing the write data word to be stored in association with the memory address of the write request in the inverted form.

25. The method of claim 24, comprising, responsive to the occurrence of a cache miss in the cache array for the write request:

sending a read request comprising the memory address of the write request to a higher-level memory;

receiving a higher-level data word corresponding to the memory address of the write request in response to the read request;

storing the higher-level data word as the current cache data word in the cache data field in the cache entry corresponding to the memory address of the write request;

generating the bit change track word in the bit change track field in the cache entry among the one or more cache entries in the cache array corresponding to the memory address of the write request, the bit change track word indicating the bit inversion state based on the bit inversions between the write data word and the current cache data word stored in the cache data field in the cache entry;

determining if the write data word is to be stored in the inverted form based on the bit inversion state; and responsive to determining that the write data word is to be stored in the inverted form, causing the write data word to be stored in association with the memory address of the write request in the inverted form.

26. The method of claim 21, comprising:

determining a number of the bit inversions in the bit change track word stored in the bit change track field in the cache entry in the cache array; and responsive to determining that the number of the bit inversions in the bit change track word is greater than one-half a number of bits of the write data word, causing the write data word to be stored in association with the memory address of the write request in the inverted form.

27. The method of claim 21, comprising:

determining a number of the bit inversions in the bit change track word stored in the bit change track field in the cache entry in the cache array; and responsive to determining that the number of the bit inversions in the bit change track word is less than or equal to one-half the number of bits of the write data word, causing the write data word to be stored in association with the memory address of the write request in a non-inverted form.

28. The method of claim 21, comprising:

determining a number of the bit inversions in the bit change track word stored in the bit change track field in the cache entry in the cache array; and responsive to determining that the number of the bit inversions in the bit change track word is greater than or equal to one-half a number of bits of the write data word, causing the write data word to be stored in association with the memory address of the write request in the inverted form.

29. The method of claim 21, comprising:

determining a number of the bit inversions in the bit change track word stored in the bit change track field in the cache entry in the cache array; and responsive to determining that the number of the bit inversions in the bit change track word is less than one-half the number of bits of the write data word, causing the write data word to be stored in association with the memory address of the write request in a non-inverted form.

30. A memory system comprising:

a higher-level memory comprising one or more memory entries, each associated with a memory address and each comprising a data field; and a cache memory comprising:

a cache array comprising one or more cache entries, each cache entry associated with a memory entry among the one or more memory entries of the higher-level memory and each cache entry comprising a cache data field and a bit change track field;

a cache controller configured to write data in the one or more cache entries of the cache array, the cache controller configured to:

receive a write request comprising a memory address associated with one of the one or more memory entries of the higher-level memory and a write data word;

generate a bit change track word in the bit change track field in a cache entry among the one or more cache entries in the cache array corresponding to the memory address of the write request, the bit change track word indicating a bit inversion state based on bit inversions between the write data word and a current cache data word stored in the cache data field in the cache entry;

determine if the write data word is to be stored in an inverted form based on the bit inversion state; and responsive to determining that the write data word is to be stored in the inverted form, cause the write data word to be stored in association with the memory address of the write request in the inverted form;

the higher-level memory configured to store the write data word in the inverted form in a data field of one of the one or more memory entries.

31. The memory system of claim 30, wherein:

the cache controller is further configured to, responsive to determining that the write data word is to be stored in a non-inverted form:

generate an error-correcting code (ECC) word for the write data word based on the non-inverted form of the write data word; and cause the ECC word to be stored in association with the memory address of the write request; and the higher-level memory is further configured to store the ECC word in association with the memory address of the write request.

* * * * *